(12) United States Patent
Kirkus

(10) Patent No.: US 7,435,099 B2
(45) Date of Patent: Oct. 14, 2008

(54) ELECTRICAL CONNECTOR AND PACKAGING ASSEMBLY

(75) Inventor: Edmund Kirkus, Lemont, IL (US)

(73) Assignee: Cinch Connectors, Inc., Lombard, IL (US)

( * ) Notice: Subject to any disclaimer, the term of this patent is extended or adjusted under 35 U.S.C. 154(b) by 0 days.

(21) Appl. No.: 11/643,387

(22) Filed: Dec. 21, 2006

(65) Prior Publication Data

US 2008/0153342 A1    Jun. 26, 2008

(51) Int. Cl.
*H01R 12/00* (2006.01)
(52) U.S. Cl. .................................... 439/66; 206/722
(58) Field of Classification Search .................... 439/82, 439/97, 101, 66; 206/724, 722, 723, 725, 206/726, 701; 269/74
See application file for complete search history.

(56) References Cited

U.S. PATENT DOCUMENTS

| | | | |
|---|---|---|---|
| 913,024 A | 2/1909 | Meacham | |
| 2,192,087 A | 2/1940 | Kost | |
| 2,197,220 A | 4/1940 | Kost | |
| 2,351,097 A | 6/1944 | Boeringer | |
| 3,027,609 A | 4/1962 | Parkin et al. | |
| 3,036,793 A | 5/1962 | Becker | |
| 4,747,483 A | 5/1988 | Grabbe | |
| 4,832,612 A | 5/1989 | Grabbe et al. | |
| 4,950,173 A * | 8/1990 | Minemura et al. | 439/82 |
| 5,058,742 A | 10/1991 | Ross | |
| 5,131,535 A | 7/1992 | O'Connor et al. | |
| 5,195,860 A | 3/1993 | Steyn | |
| 5,310,055 A | 5/1994 | Chu | |
| 5,400,904 A | 3/1995 | Maston, III et al. | |
| 5,465,470 A | 11/1995 | Vongfuangfoo et al. | |
| 5,566,840 A | 10/1996 | Waldner et al. | |
| 5,758,776 A | 6/1998 | Slocum et al. | |
| 5,839,918 A | 11/1998 | Matsuoka | |
| 5,911,329 A | 6/1999 | Wark et al. | |
| 5,927,503 A | 7/1999 | Nevill et al. | |
| 5,988,619 A | 11/1999 | Wark et al. | |
| 5,992,649 A | 11/1999 | Wark et al. | |
| 6,070,731 A | 6/2000 | Kobayashi et al. | |
| 6,158,595 A | 12/2000 | Wark et al. | |
| 6,398,043 B1 | 6/2002 | Wark et al. | |
| 6,412,546 B1 | 7/2002 | Lin et al. | |
| 6,446,818 B1 | 9/2002 | Dubey et al. | |
| 6,591,992 B1 | 7/2003 | Dubey et al. | |
| 6,655,535 B2 | 12/2003 | Wark et al. | |

(Continued)

FOREIGN PATENT DOCUMENTS

DE    40 16 890 A1    11/1991

(Continued)

*Primary Examiner*—Phuong K Dinh
(74) *Attorney, Agent, or Firm*—Leydig, Voit & Mayer, Ltd

(57) ABSTRACT

The electrical connector may include an insulative housing with a first surface, a second surface, and at least on aperture extending between the first and second surfaces for receiving at least one electrical contact. The housing may further include at least one hole therethrough and at least one retention member. The retention member may include an opening and a plurality of fingers extending into the opening. The retention member is configured to engage a mounting post. The connector may be placed between top and bottom covers and located by use of a mounting post and retention member to form a packaging assembly for transport.

34 Claims, 27 Drawing Sheets

U.S. PATENT DOCUMENTS

| | | |
|---|---|---|
| 6,711,810 B2 | 3/2004 | Buley et al. |
| 6,739,814 B1 | 5/2004 | Horng et al. |
| 6,945,788 B2 | 9/2005 | Trout et al. |
| 7,044,755 B2 * | 5/2006 | Hatakeyama ................ 439/97 |
| 7,059,869 B2 | 6/2006 | Wertz et al. |
| 7,090,507 B2 | 8/2006 | Wertz et al. |
| 7,107,672 B2 | 9/2006 | Onitsuka et al. |
| 2003/0051338 A1 | 3/2003 | Buley et al. |
| 2003/0200855 A1 | 10/2003 | Wing et al. |

FOREIGN PATENT DOCUMENTS

| | | |
|---|---|---|
| EP | 0 706 313 | 4/1996 |
| EP | 1 691 136 A1 | 8/2006 |

* cited by examiner

ELECTRICAL CONNECTOR AND PACKAGING ASSEMBLY

BACKGROUND

Electrical connectors are commonly assembled with other components. Electrical connectors may also be assembled with other components in a packaging assembly so that the connectors may be stored or transported. The state of the art for electrical connectors has demonstrated a need for an electrical connector with a simple yet versatile retention member. More particularly, the art lacks a retention member for an electrical connector that is releasable, reusable, durable, limited in parts, compact in profile, and easy to assemble with an electrical connector.

BRIEF SUMMARY

The electrical connector may comprise an insulative housing including a first surface, a second surface, and at least one aperture extending between the first and second surfaces for receiving at least one electrical contact. The housing may further include at least one hole therethrough and at least one retention member. The retention member may define an opening therethrough. The retention member may include a plurality of fingers extending into the opening. The retention member may be attached to the housing such that the opening of the retention member communicates with the hole of the housing. The retention member is configured to engage a mounting post when the mounting post is selectively inserted into the retention member. The fingers of the retention member may flexibly engage the mounting post to retain the mounting post in the retention member.

In another embodiment, there is provided a packaging assembly for an electrical connector comprising an electrical connector, a top cover, and a bottom cover. The electrical connector may comprise an insulative housing including a first surface, a second surface, and at least one aperture extending between the first and second surfaces for receiving at least one electrical contact. The housing may further include at least one hole therethrough and at least one retention member. The retention member may define an opening therethrough. The retention member may include a plurality of fingers extending into the opening. The retention member may be attached to the housing such that the opening of the retention member communicates with the hole of the housing. The top cover may be selectively disposed over at least a portion of the first surface of the housing and the bottom cover may be selectively disposed over at least a portion of the second surface of housing such that the electrical connector is disposed between the top and bottom covers. The top cover and the bottom cover may be selectively attached by attachment means.

In another embodiment, the bottom cover may include an inside surface facing the second surface of the insulative housing and a mounting post extending from the inside surface. The mounting post may extend through the hole of the housing and through the opening of the retention member. The fingers of the retention member may flexibly engage the mounting post to retain the mounting post in the retention member.

In another embodiment, the insulative housing may include a second hole in the insulative housing and a second retention member including an opening. The opening of the second retention member communicates with the second hole of the housing. The bottom cover may include a second mounting post extending from the inside surface. The second mounting post may extend through the second hole of the housing and through the opening of the second retention member. The fingers of the second retention member may flexibly engage the second mounting post to retain the mounting post in the retention member.

DETAILED DESCRIPTION OF THE DRAWINGS

Figure 1:
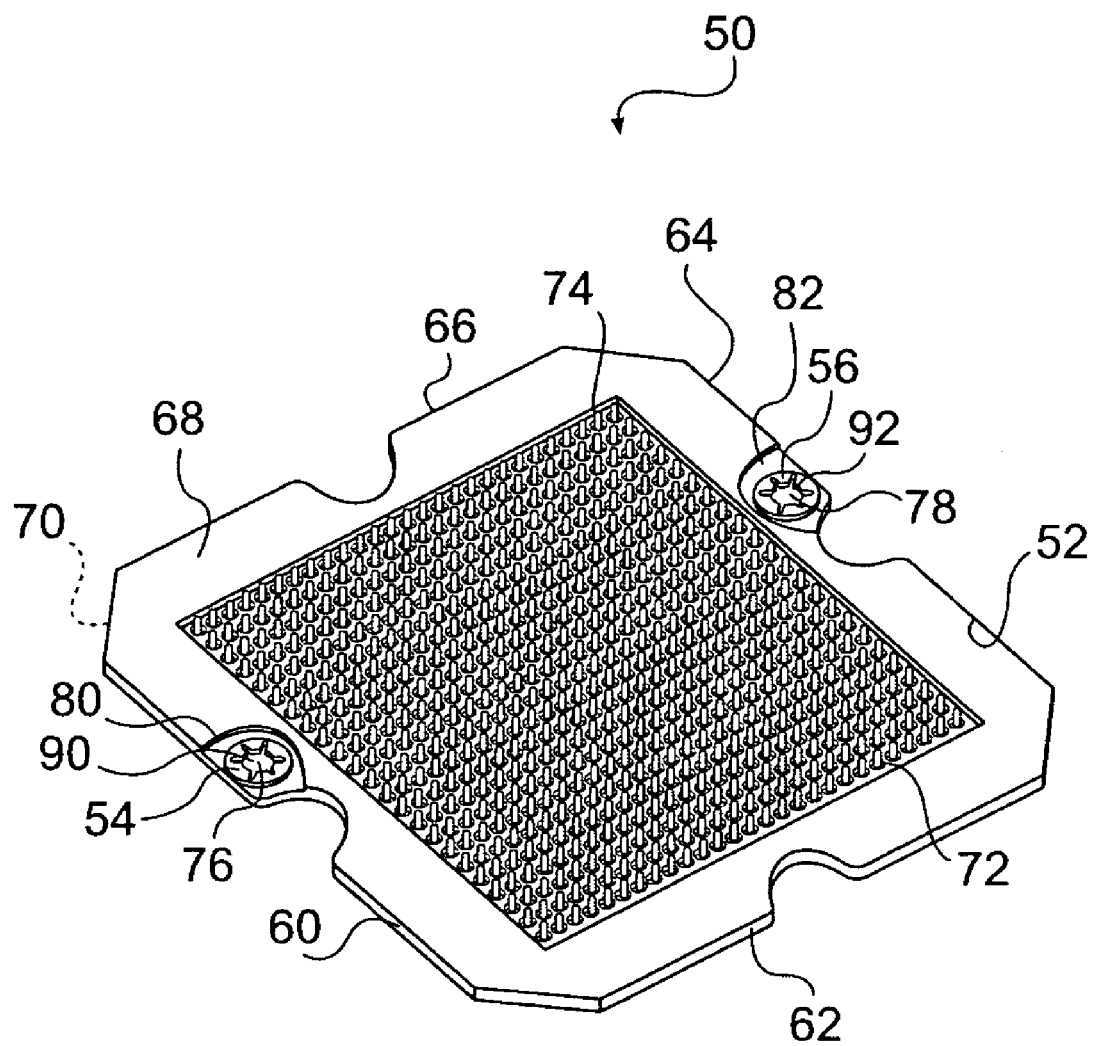
FIG. 1 is a perspective view of an electrical connector.
Figure 2:
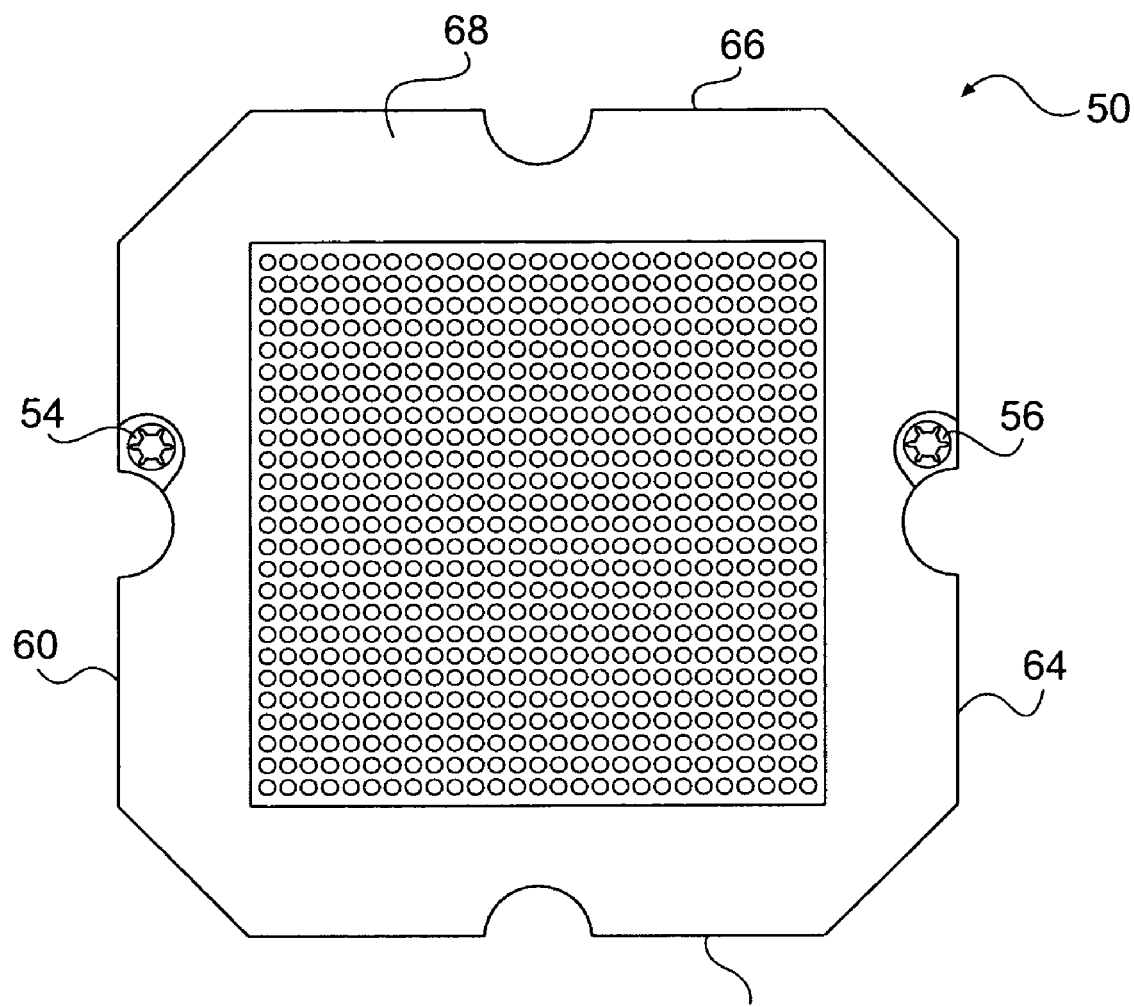
FIG. 2 a top view of the electrical connector of FIG. 1 without contacts.
Figure 4:
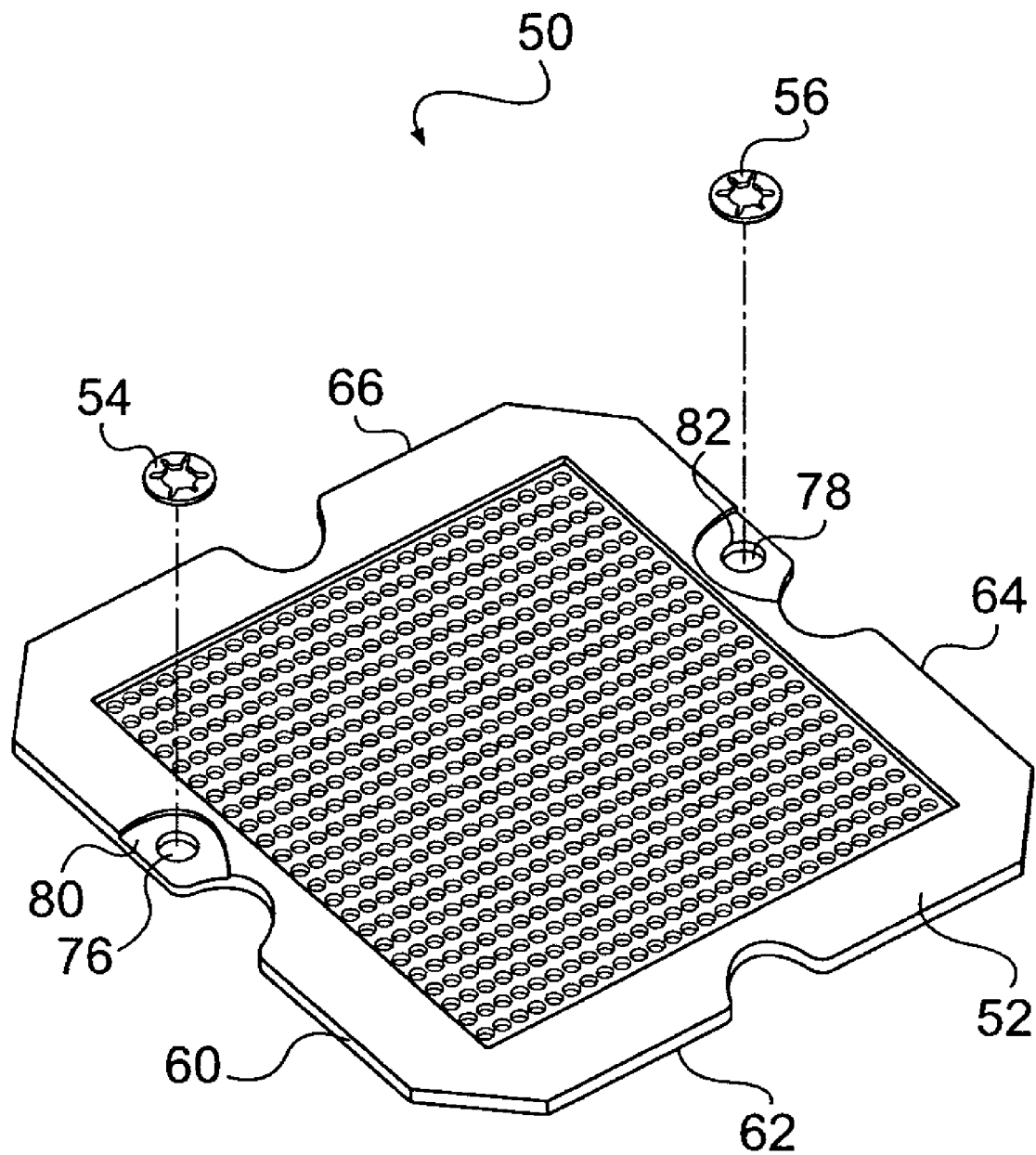
FIG. 4 is an exploded view of the electrical connector of FIG. 1.
Figure 5:
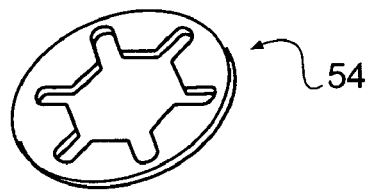
FIG. 5 is a perspective view of a retention member of FIG. 1.

Referring to FIG. 1, an electrical connector 50 may comprise an insulative housing 52, a first retention member 54, and a second retention member 56. The connector 50 may be generally planar and include first, second, third, and fourth edges 60, 62, 64, 66. The insulative housing 52 may include a first surface 68, a second surface 70, and a plurality of apertures 72 extending between the first and second surfaces 68, 70 of the housing 52. The electrical connector 50 may include a plurality of electrical contacts 74, wherein each aperture 72 may include an electrical contact 74 for establishing an electrical connection between the first and second surfaces 68, 70 through the connector 50. Referring to FIG. 4, the housing 52 may include first and second holes 76, 78 corresponding to the first and second retention members 54, 56, respectively. The holes 76, 78 may be disposed opposite each other along the first and third edges 60, 64, respectively. The insulative housing 52 may include first and second recesses 80, 82 surrounding the first and second holes 76, 78, respectively. In other embodiments, the housing may not include recesses.

Figure 3:
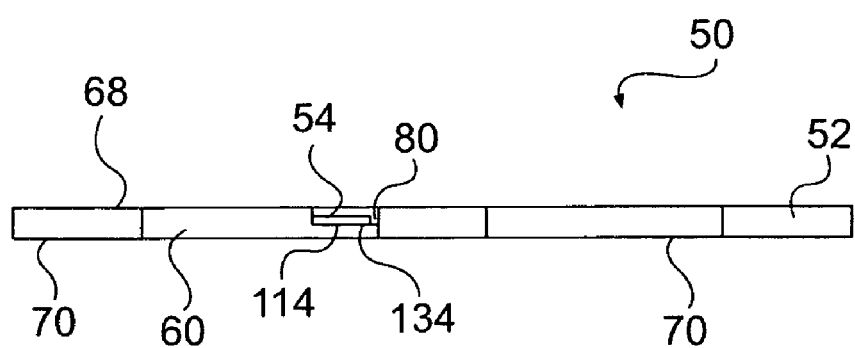
FIG. 3 is side view of the electrical connector of FIG. 1.

Referring to FIG. 1, the first and second retention members 54, 56 include respective openings 90, 92. The first and second retention members 54, 56 may be disposed over the first and second holes 76, 78, respectively, such that the opening 90 of the first retention member 54 communicates with the first hole 76 and the opening 92 of the second retention member 56 communicates with the second hole 78. Referring to FIG. 4, the retention members 54, 56 may be thin, planar discs. As shown in FIG. 1, the first and second retention members 54, 56 may be disposed in the first and second recesses 80, 82 of the insulative housing 52. Accordingly, the retention members 54, 56 may not extend above the first surface 68 of the housing 52, as shown in FIG. 3. Referring to FIG. 4, the retention members 54, 56 are therefore less likely to interfere when the electrical connector 50 is coupled to other components. The recessed location of the retention members 54, 56 also reduces the possibility of the retention members 54, 56 being unintentionally dislodged by contact with a foreign object.

Figure 6:
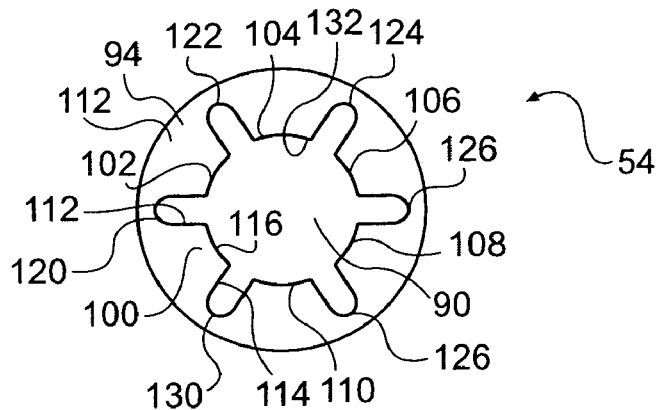
FIG. 6 is a top view of a retention member of FIG. 1.
Figure 34:
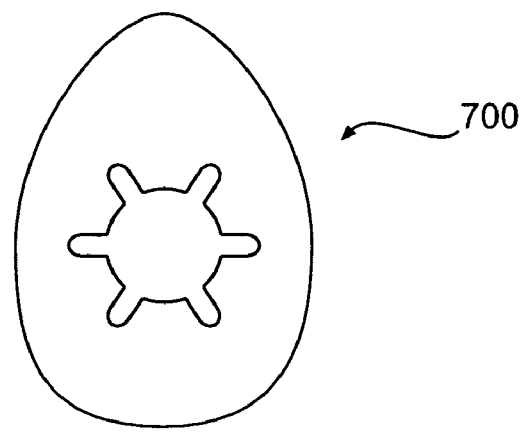
FIG. 34 is a top view of another embodiment of the retention member.
Figure 35:
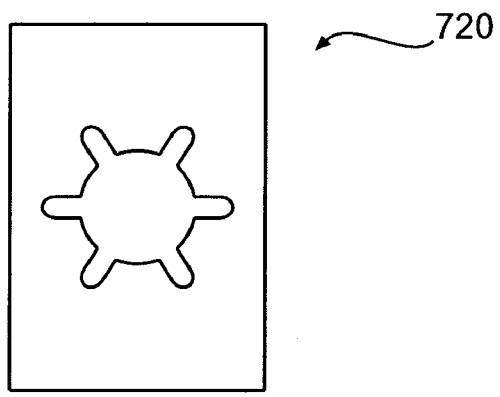
FIG. 35 is a top view of another embodiment of the retention member.
Figure 36:
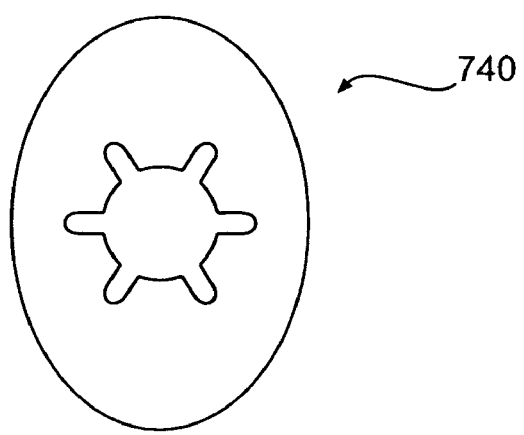
FIG. 36 is a top view of another embodiment of the retention member.

The first and second retention members 54, 56 may be similarly constructed. Therefore, only the first retention member 54 will be described in detail. Referring to FIG. 6, the retention member 54 may be annular. In other embodiments, the retention member may have other shapes. In one embodiment, the retention member 700 may be an oval, as shown in FIG. 34. In another embodiment, the retention member 720 may be a rectangle, as shown in FIG. 35. In another embodiment, the retention member 740 may be an ellipse, as shown in FIG. 36. Referring to FIG. 6, the retention member 54 may include an outer ring 94 surrounding the opening 50, wherein the opening 90 is located at the center of the retention member 54. In other embodiments, the opening may not be located at the center of the retention member. The retention member 54 may include a plurality of fingers 100, 102, 104, 106, 108, 110 extending into the opening 90.

Figure 8:
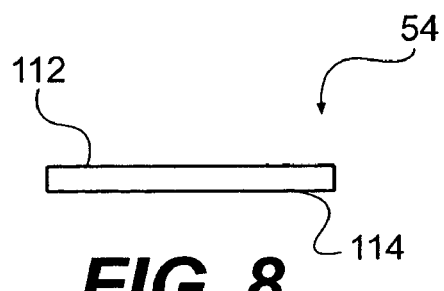
FIG. 8 is a side view of a retention member of FIG. 1.

Referring to FIG. 8, the retention member 54 may be made of a thin material, such as a film, and include a top surface 112 and a bottom surface 114. Referring to FIG. 6, the retention member 54 may be made of a flexible film that permits the fingers 100, 102, 104, 106, 108, 110 to individually flex with respect the remainder of the retention member 54. In one embodiment, the retention member 54 may be made of a polyimide film such as, for example, Kapton® polyimide film by Dupont®. In another embodiment, the retention member 54 may be made of a PET polyester film such as, for example, Mylar® film by Dupont®. In other embodiments, the retention member 54 may be made of any material capable of demonstrating the requisite qualities as described below.

Referring to FIG. 6, the retention member may include first, second, third, fourth, fifth, and sixth fingers 100, 102, 104, 106, 108, 110. In other embodiments, the retention member 54, may include a different number of fingers. The fingers 100, 102, 104, 106, 108, 110 may extend from the outer ring 94 into the opening 90 of the retention member 54. The first finger 100 may include a first side 112, a second side 114, and an end 116. The finger 100 may taper between the outer ring 94 and an end 116. In other embodiments, the fingers may have a different shape. All of the fingers 100, 102, 106, 108, 110 may be similarly constructed. In other embodiments, some fingers may have different constructions than other fingers. The fingers 100, 102, 104, 106, 108, 110 may be equally spaced and separated by gaps 120, 122, 124, 126, 128, 130. In other embodiments, the spacing may not be equal. The ends of the fingers 100, 102, 104, 106, 108, 110 define a broken inner ring 132 wherein the breaks in the ring are formed by the gaps 122, 124, 126, 128, 130.

Figure 7:
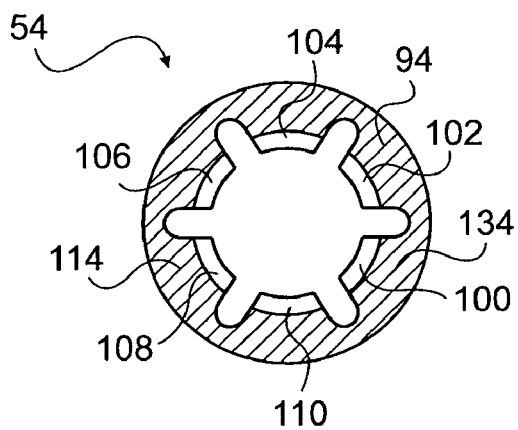
FIG. 7 is a bottom view of a retention member of FIG. 1.

Referring to FIG. 3, the bottom surface 114 of the retention member 54 may be attached to the first surface 68 of the housing 52, which is generally planar. The retention member 54 may be attached to the first surface 68 by an adhesive 134. Referring to FIG. 7, the bottom surface 114 of the retention member 54 may be coated in an adhesive 134. The adhesive 134 may be applied as a ring to the retention member 54. Accordingly, the adhesive 134 will be primarily disposed on the outer ring 94 of the retention member 54, such that the fingers 100, 102, 104, 106, 108, 110 will not include adhesive proximate the inner ring 132. The adhesive 134 on the retention member may be covered by a liner that is removed before the retention member is attached to the connector. When the retention member 54 is pressed down upon the first surface 68 of the insulative housing 52, the retention member 54 will be bonded to the insulative housing 52. In another embodiment, the adhesive 134 may be applied to the first surface 68 of the connector 50 for receiving the retention member 54. In other embodiments, the retention member 54 may be attached to the connector 50 by molding, heat staking, thermal bonding, or ultra-sonic welding.

Figure 28:
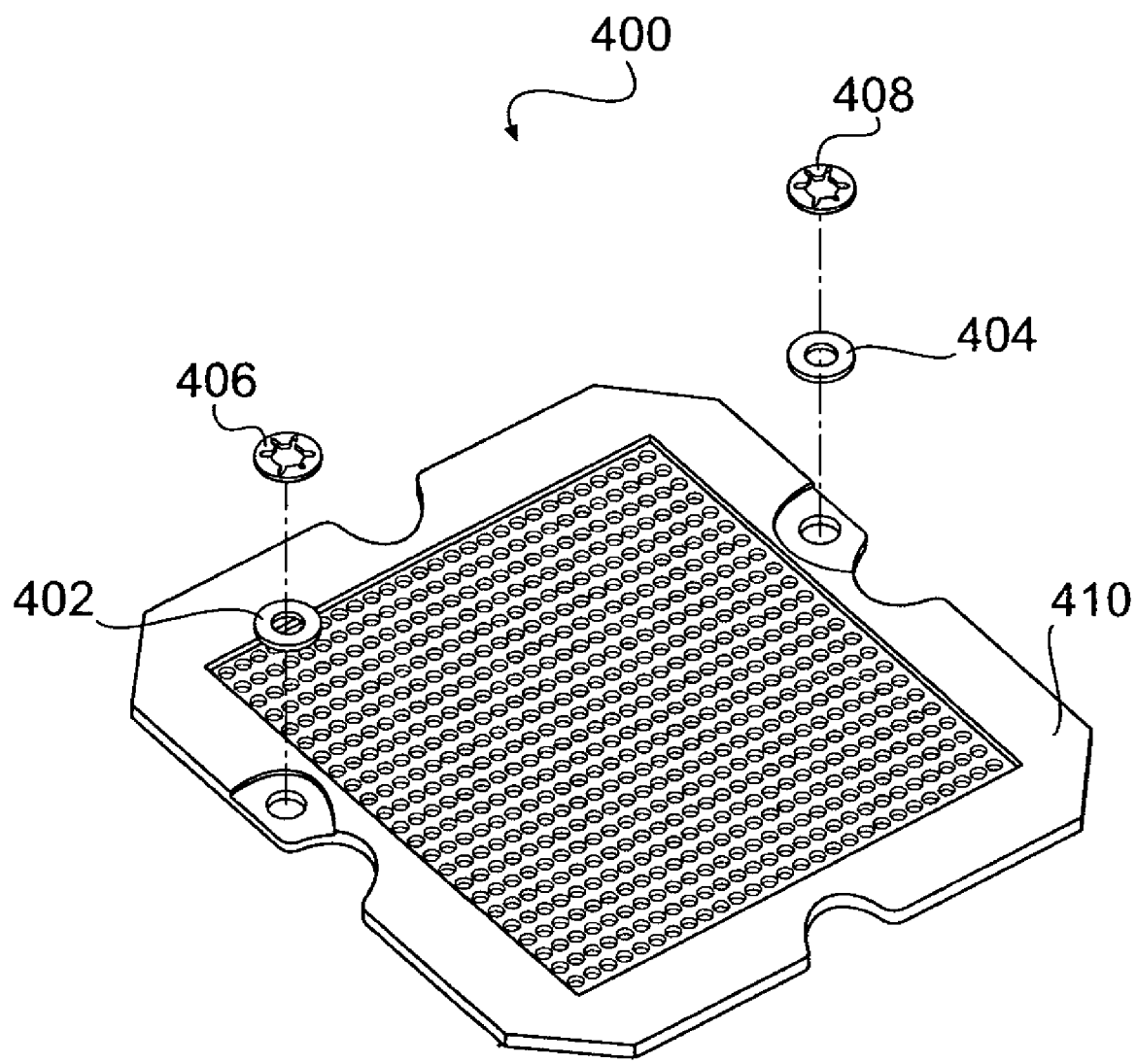
FIG. 28 is a perspective view of another embodiment of the connector.

Referring to FIG. 28, there is shown another embodiment of the electrical connector 400. The connector 400 may include first and second adhesive washers 402, 404 corresponding to the first and second retention members 406, 408. The washers 402, 404 may include adhesive on both upper and lower surfaces. When the electrical connector 400 is assembled with the washers 402, 404 disposed between the retention members 406, 408 and the housing 410, the retention members 402, 404 will be adhesively bonded to the housing 410 via the washers 402, 404. In one embodiment, the washers 402, 404 may be applied to the insulative housing 410 and then the retention members 406, 408 may be attached to the housing 410. In another embodiment, the washers 402, 404 may be applied to bottom surfaces of the retention members 406, 408, and then the retention members 406, 408 may be attached to the housing 410.

Figure 9:
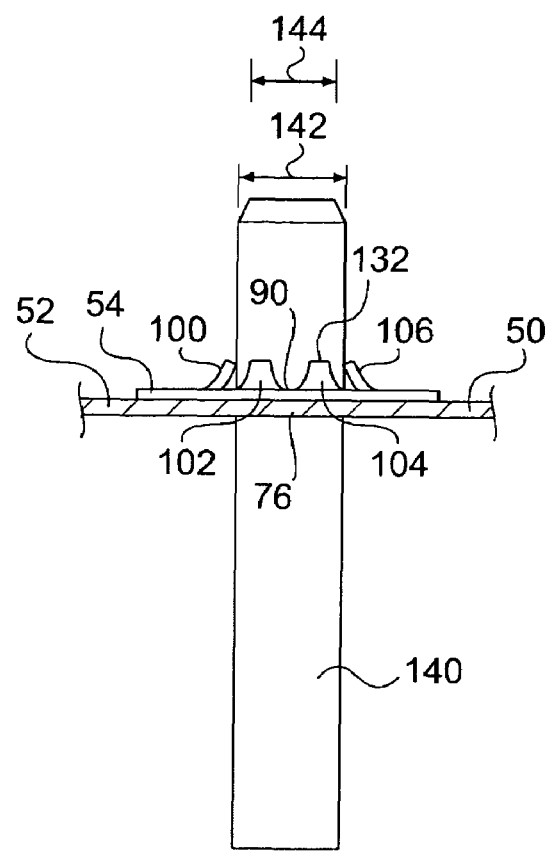
FIG. 9 is a cross section of the retention member of FIG. 1 flexibly engaging a mounting post.

Referring to FIG. 9, the connector 50 is configured to receive a mounting post 140. As the connector 50 is lowered onto the mounting post 140, the mounting post 140 enters the hole 76 of the housing 52 and then passes through the opening 90 of the retention member 54. The diameter 142 of the mounting post 140 may be greater than the normal diameter 144 of the inner ring 132 of the opening 90 of the retention member 54. Therefore, as the post 140 enters the opening 90, the post 140 forces the fingers to bend upwards from a normal position, as shown in FIG. 4, to a retaining position, as shown in FIG. 9. As the fingers 100, 102, 104, 106, (108 and 110 not shown) bend upwards, the inner ring 132 of the opening 90 is effectively widened from a normal diameter 144 to the diameter 142 of the mounting post 140 in order to accommodate the mounting post 140. Because the retention member 54 is made of a flexible material, the fingers 100, 102, 104, 106, (108 and 110 not shown) flex back towards the normal position while in the retaining position, exerting a force against the mounting post 140. Accordingly, the retention member 54 retains the mounting post 140 by a friction fit. In other embodiments, the retention member 54 may retain a mounting post by an interference fit.

Figure 10:
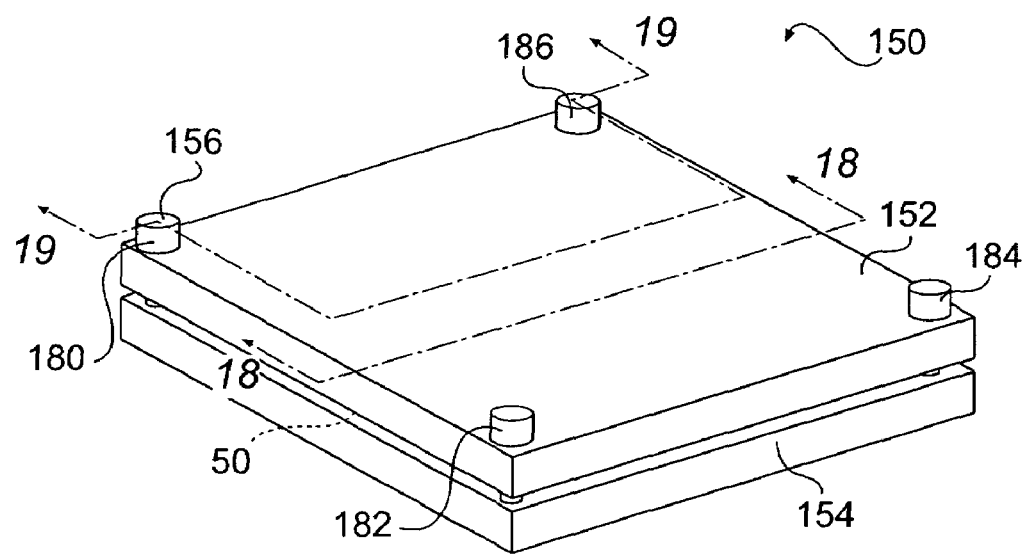
FIG. 10 is perspective view of a packaging assembly for the electrical connector of FIG. 1
Figure 11:
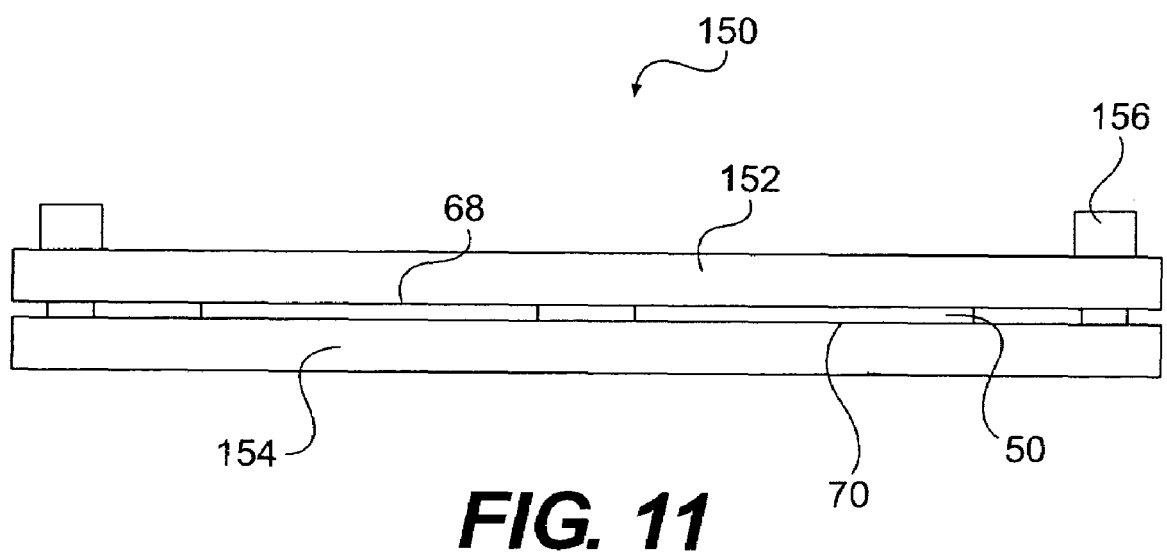
FIG. 11 is a side view of the packaging assembly of FIG. 10.

Referring to FIGS. 10 and 11, the connector 50 may be included in a packaging assembly 150 to facilitate transport or storage of the electrical connector 50. The packaging assembly may include a top cover 152, a bottom cover 154, and attachment means 156 to attach the top and bottom covers 152, 154. The electrical connector 50 is disposed between the top and bottom covers 152, 154. Referring to FIG. 11, the top cover 152 is disposed over the first surface 68 of the connector 50 and the bottom cover 154 is disposed over the second surface 70 of the connector 50.

Figure 12:
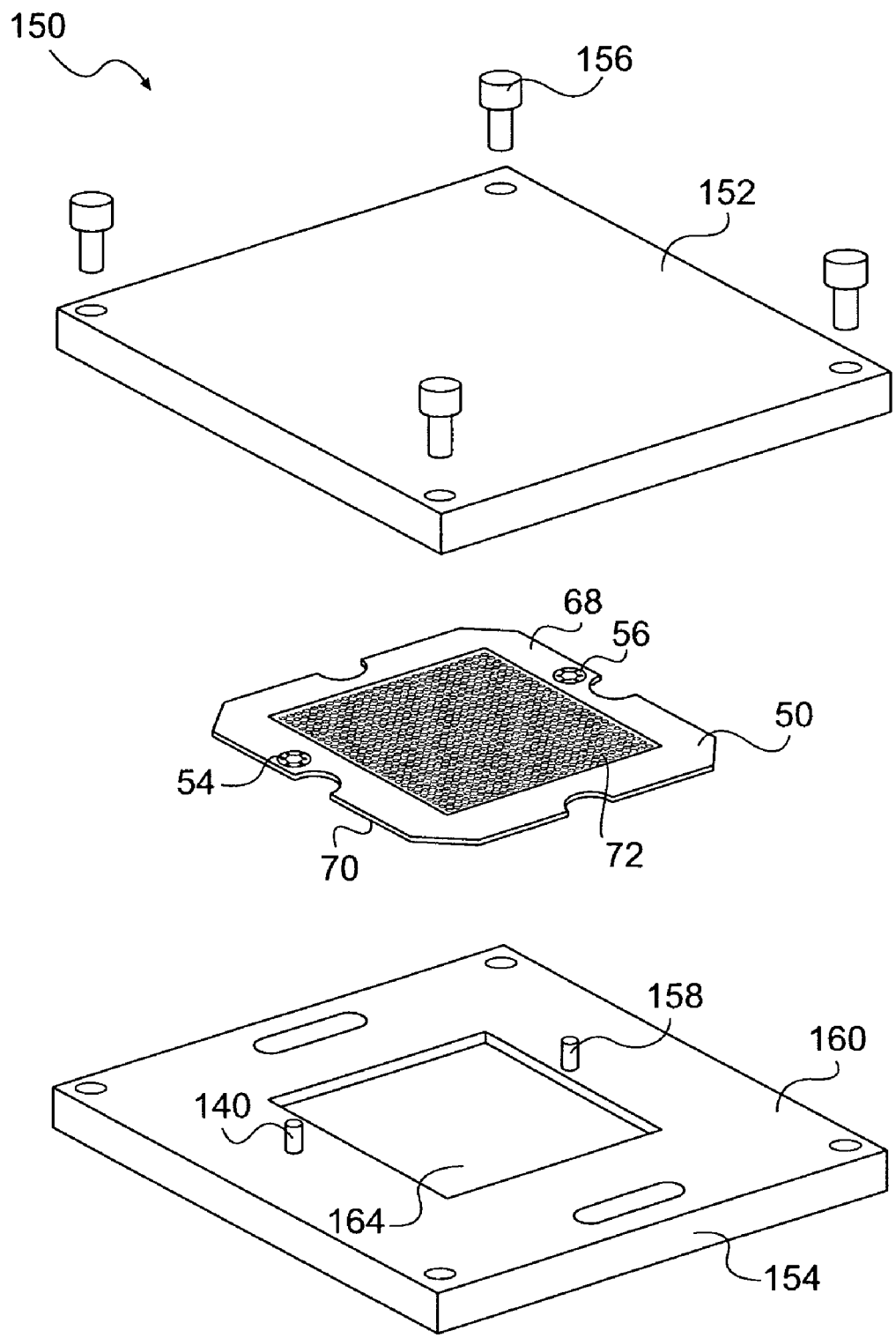
FIG. 12 is an exploded view of the packaging assembly of FIG. 10.

Referring to FIG. 12, the packaging assembly 150 is configured to be assembled and disassembled multiple times. For example, the connector 50 may be packaged in the packaging assembly 150 before transporting or storing the assembly 150. The packing assembly 150 may be disassembled upon arrival at a destination or removal from storage. The connector 50 may then be utilized in a particular operation or may be assembled with other components. Alternatively, the connector 50 may be utilized in a particular operation or function and then repackaged in the packaging assembly 150 for storage or transport to another location.

Figure 37:
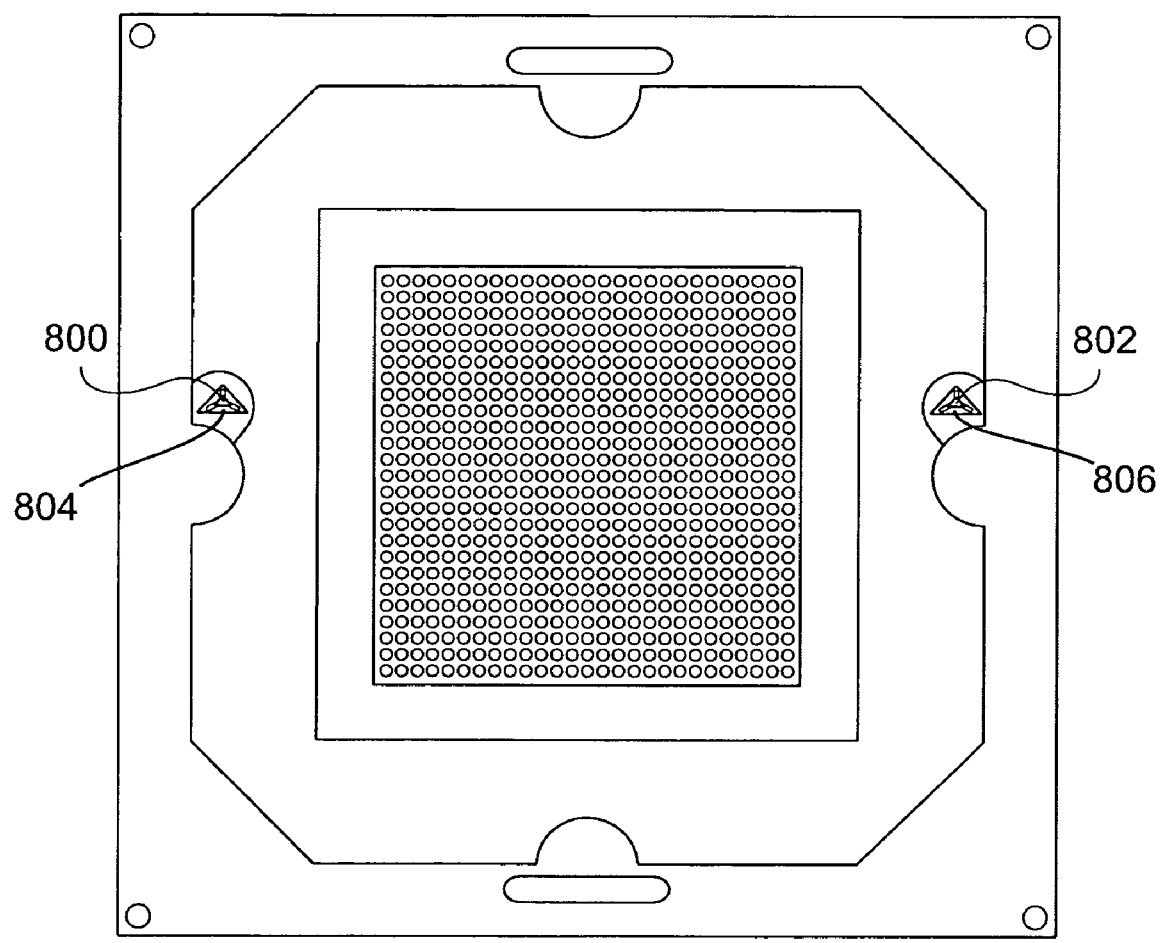
FIG. 37 is a top view of another embodiment of the connector and the bottom cover.
Figure 38:
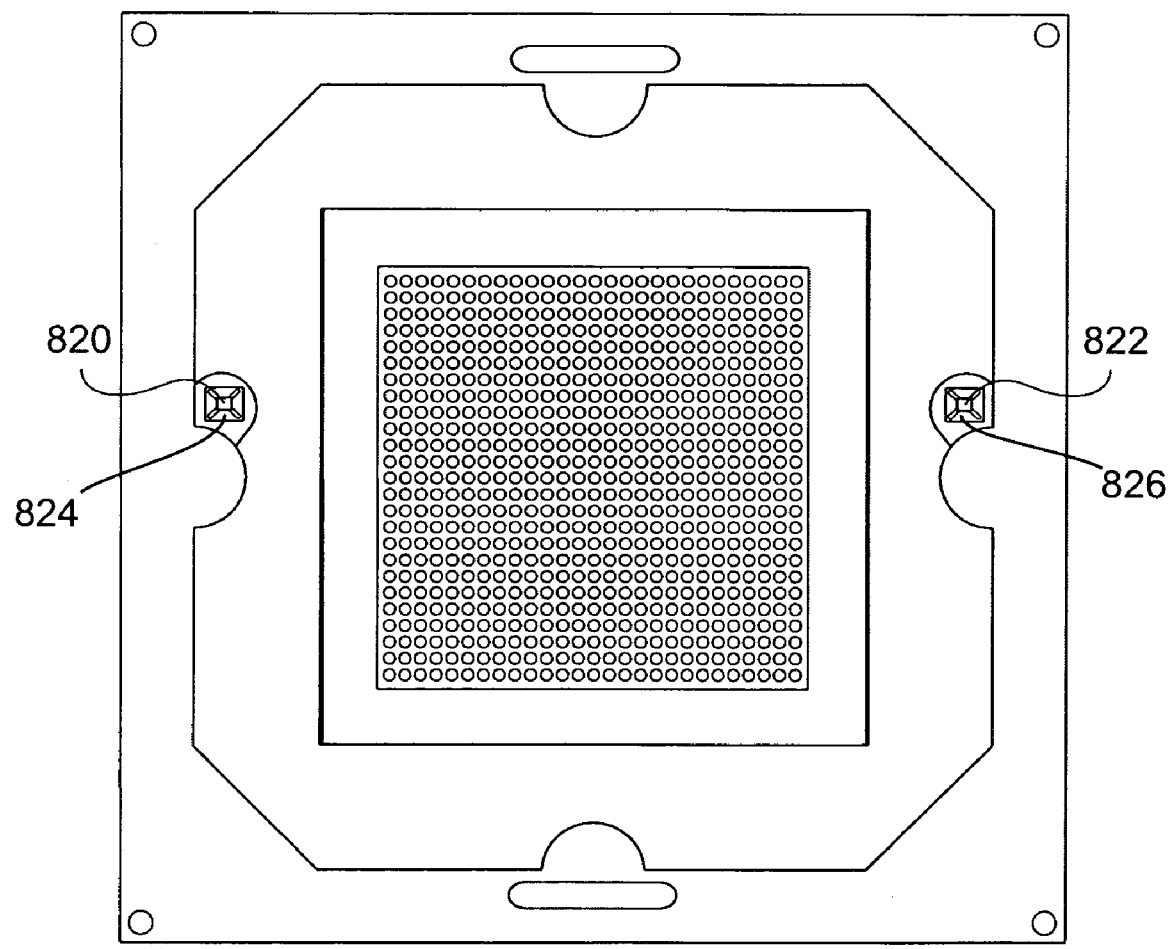
FIG. 38 is a top view of another embodiment of the connector and the bottom cover.
Figure 39:
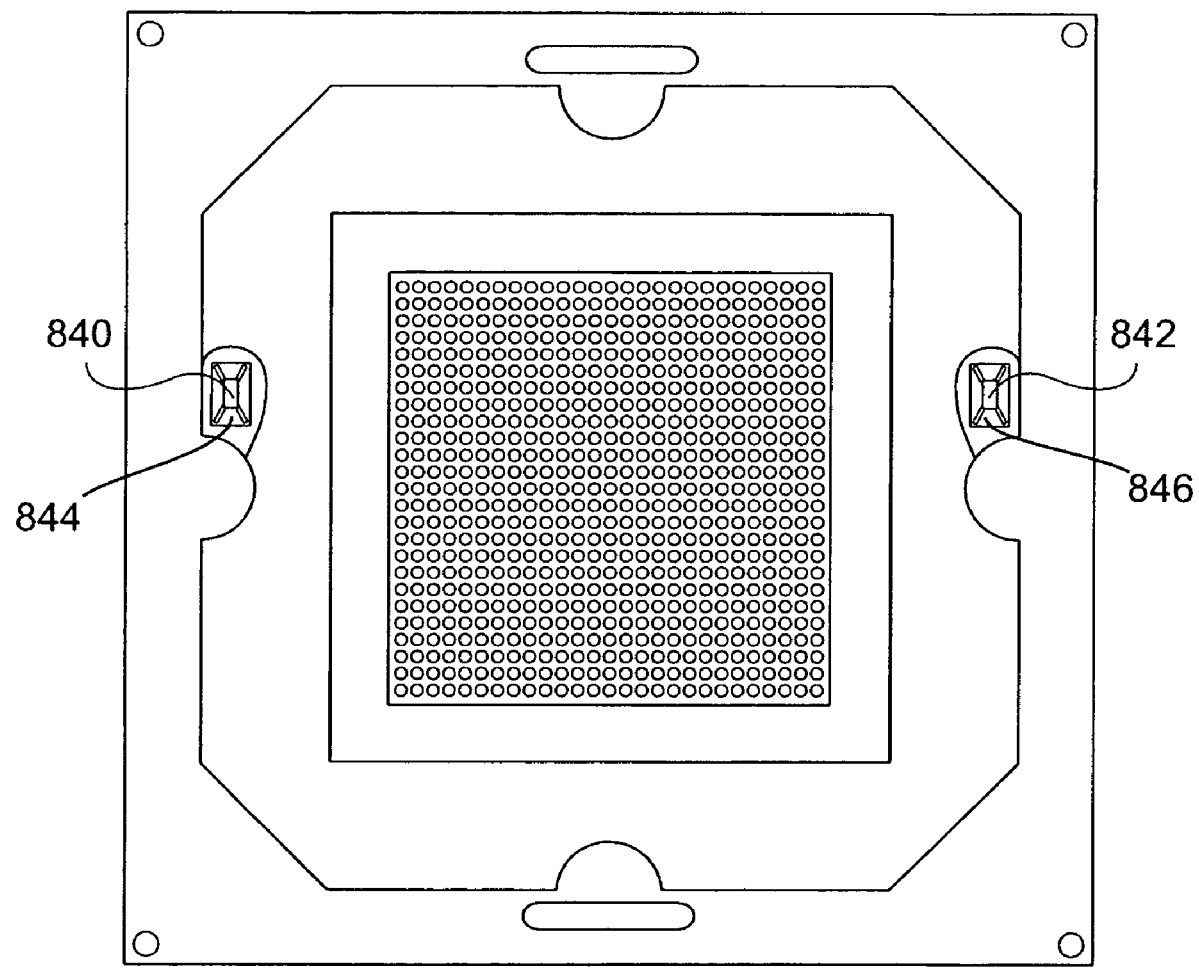
FIG. 39 is a top view of another embodiment of the connector and the bottom cover.
Figure 40:
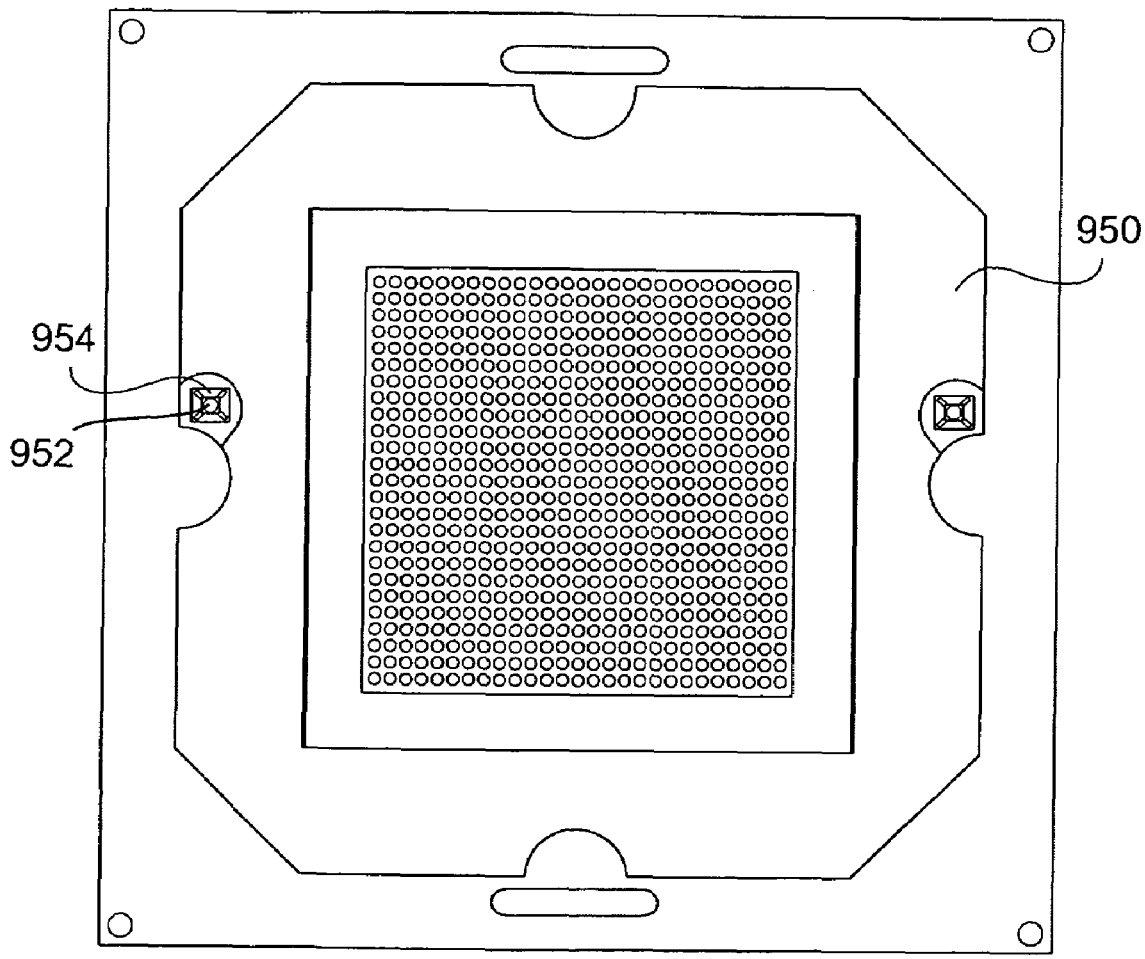
FIG. 40 is a top view of another embodiment of the connector and the bottom cover

Referring to FIG. 12, the bottom cover 152 may include a first mounting post 140 and a second mounting post 158 extending from an inside surface 160, which faces the second surface 70 of the connector 50. The mounting posts 140, 158 may be generally cylindrical and sized to be engagingly received by the retention members 54, 56. In other embodiments, the posts may have other cross-sectional shapes. In one embodiment, the retention posts 800, 802 may be triangular, as shown in FIG. 37. In another embodiment, the mounting posts 820, 822 may be square, as shown in FIG. 38. In another embodiment, the mounting posts 840, 842 may be rectangular, as shown in FIG. 39. The openings in the retention members may have a corresponding shape as the mounting post. Referring to FIG. 37, the retention members 804, 806 may be triangular and have triangular openings corresponding to their respective triangular mounting posts 800, 802. Referring to FIG. 38, the retention members 824, 826 may be square and have square openings corresponding to their respective square mounting posts 820, 822. Referring to FIG. 39, the retention members 844, 846 may be rectangular and have rectangular openings corresponding to their respective rectangular mounting posts 840, 842. In other embodiments, the opening in the retention member may have a shape different then the cross-sectional shape of the mounting post. For example, referring to FIG. 40, the connector 950 may have a square retention member 954 with a square opening for receiving a cylindrical retention post 952.

Figure 13:
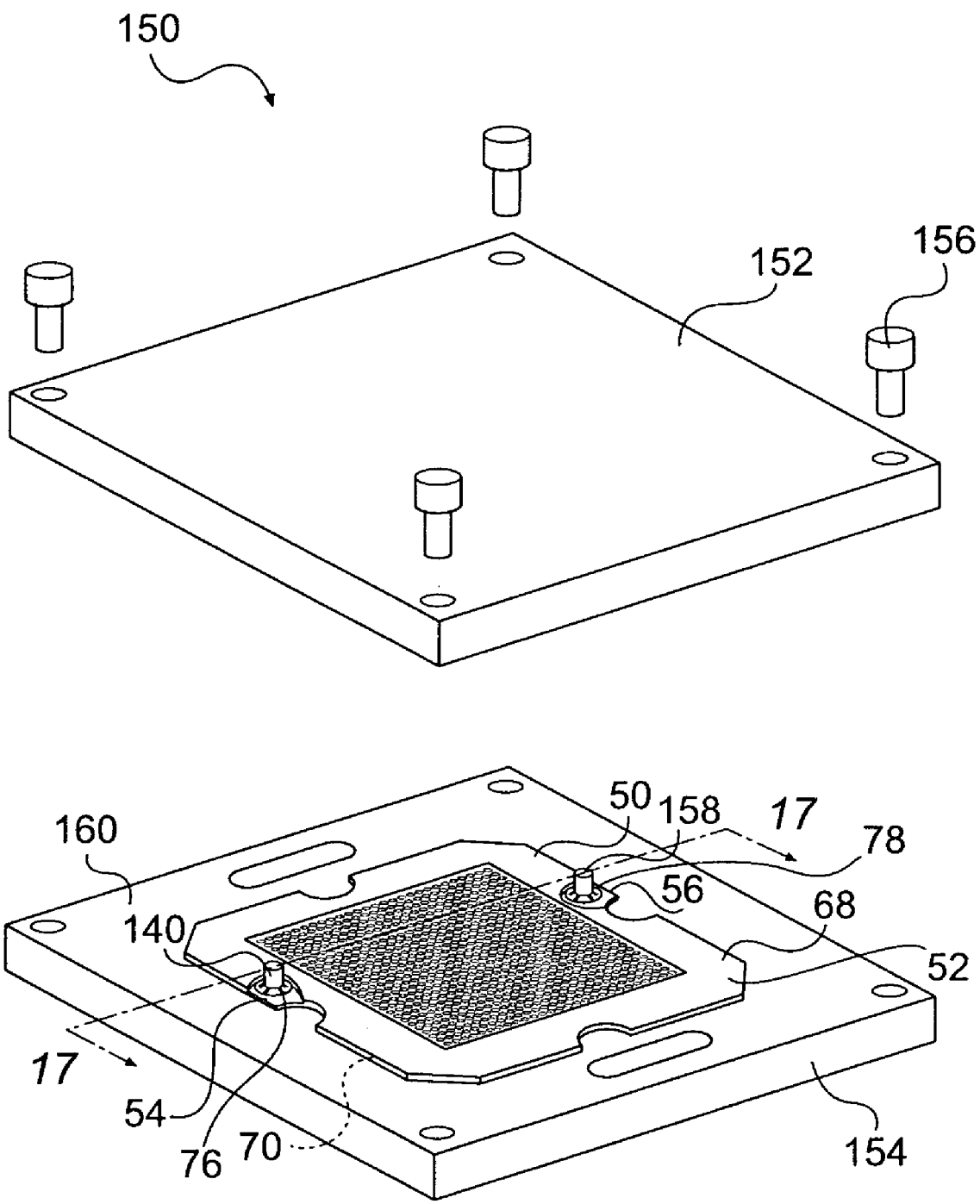
FIG. 13 is a partially exploded view of the packaging assembly of FIG. 10.

Referring to FIG. 13, the first and second mounting posts 140, 158 may extend through the first and second holes 76, 78 of the housing 52, respectively, and also through the first and second retention members 54, 56, respectively. The fingers of the retention members may flexibly engage the mounting posts 140, 158 to retain the mounting posts 140, 158 in the retention members 54, 56, as shown in FIG. 13. The connector 50 may thereby be mounted to the bottom cover 154 such that the second surface 70 of the connector 50 is proximate the inside surface 160 of the bottom cover 154.

Referring to FIG. 13, the mounting posts 140, 158 also serve to locate the electrical connector 50 at a predetermined position within the packaging assembly 150. The first and second mounting posts 140, 158 may be located on opposite sides of the bottom cover 154. Referring to FIG. 12, the inside surface 160 of the bottom cover 154 may include a recess 164 to receive the contacts of the connector 50 therein. The mounting posts 140, 158 and the retention members 54, 56 flexibly engage to locate the electrical connector 50 such that the electrical apertures 72 align with the recess 164, thereby generally locating the connector 50 in the bottom cover 154.

Figure 14:
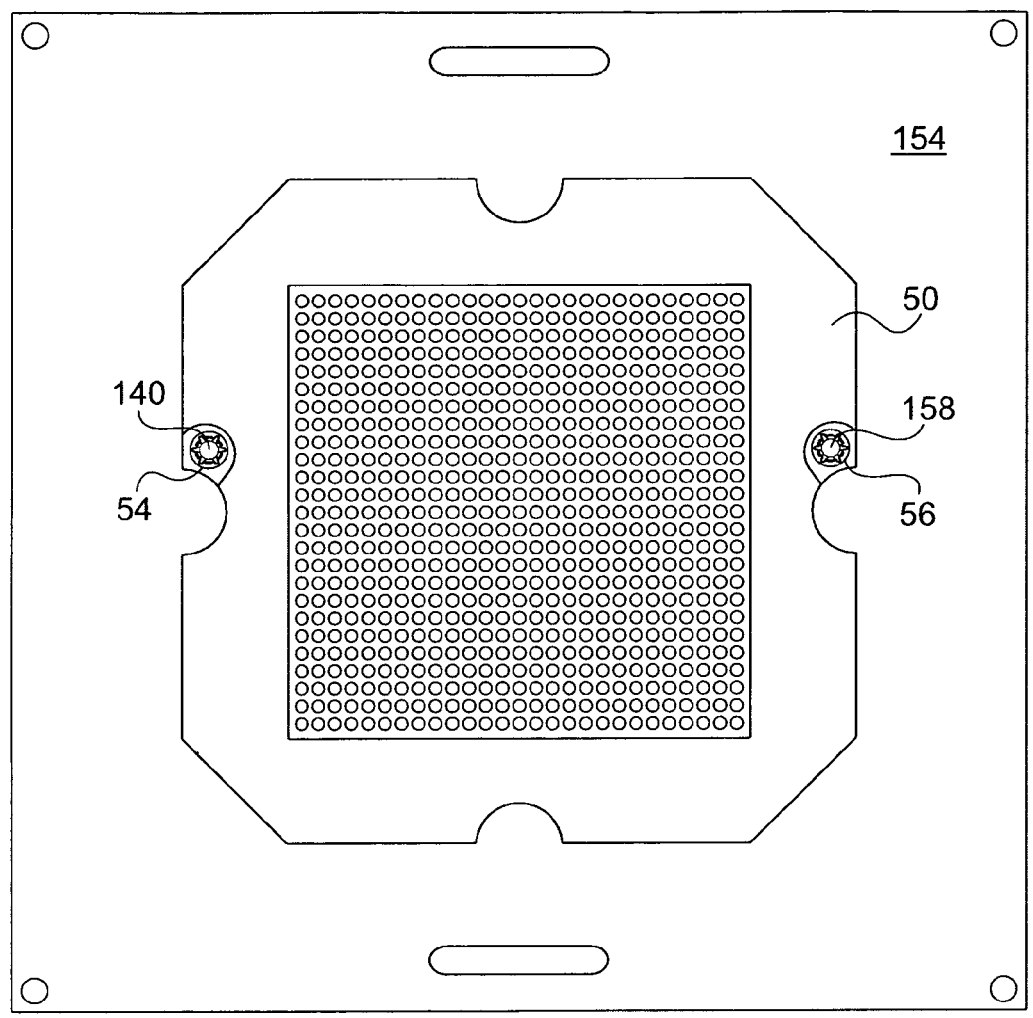
FIG. 14 is a top view of the assembly of FIG. 13.
Figure 15:
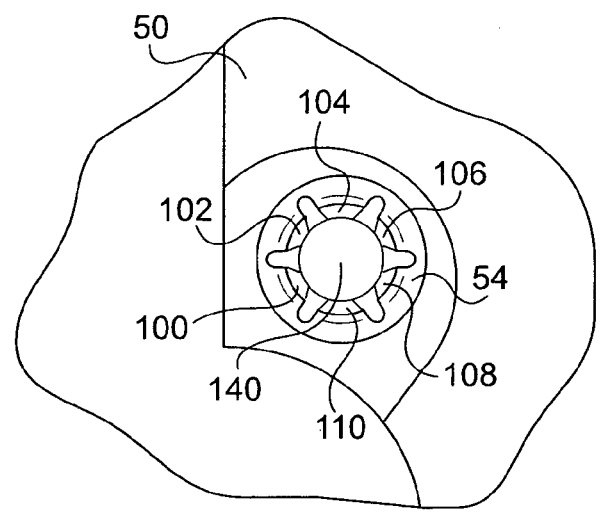
FIG. 15 is a partial view of FIG. 13 showing the first retention member.
Figure 16:
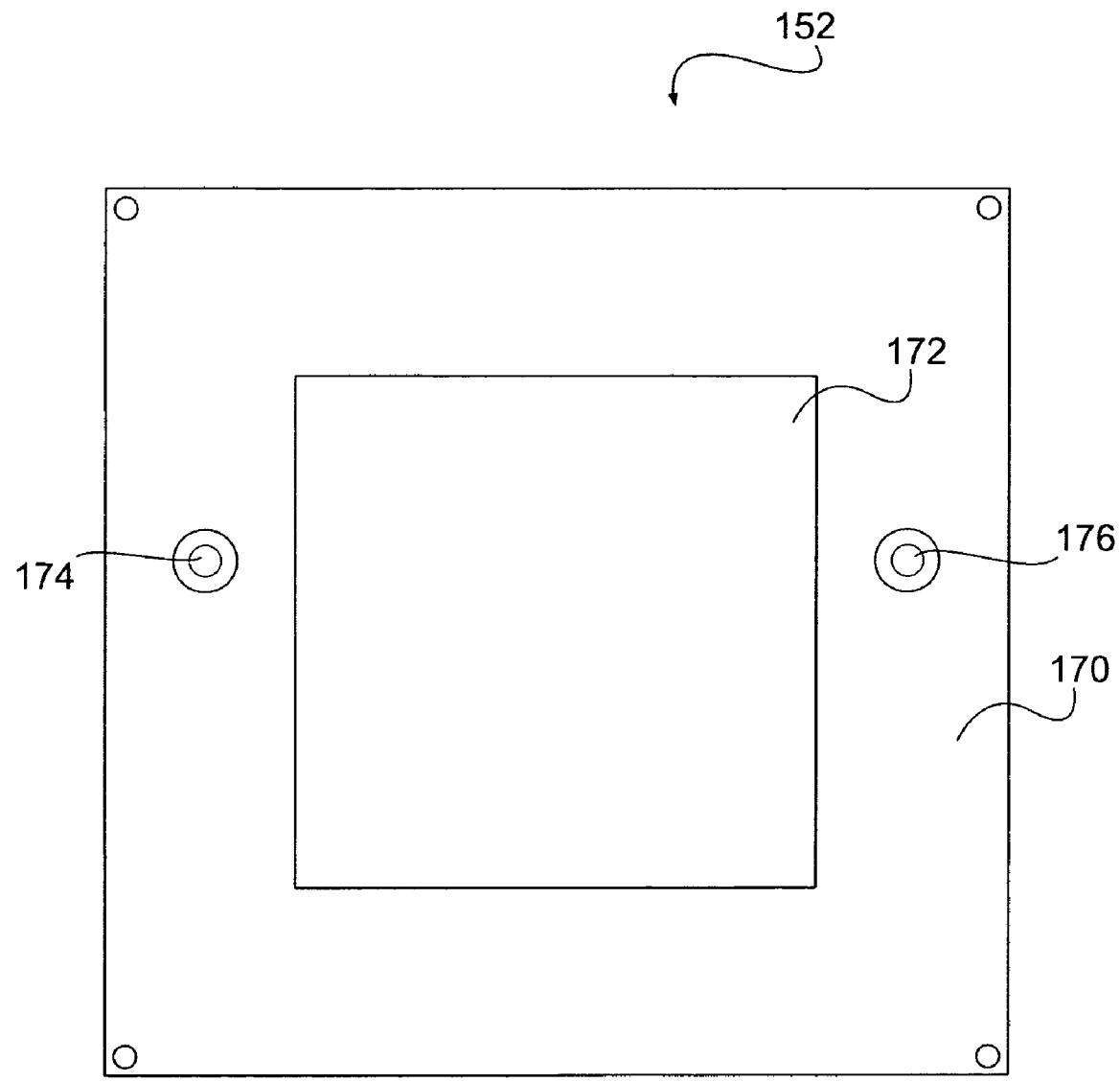
FIG. 16 is a bottom view of the top cover of FIG. 10.
Figure 17:
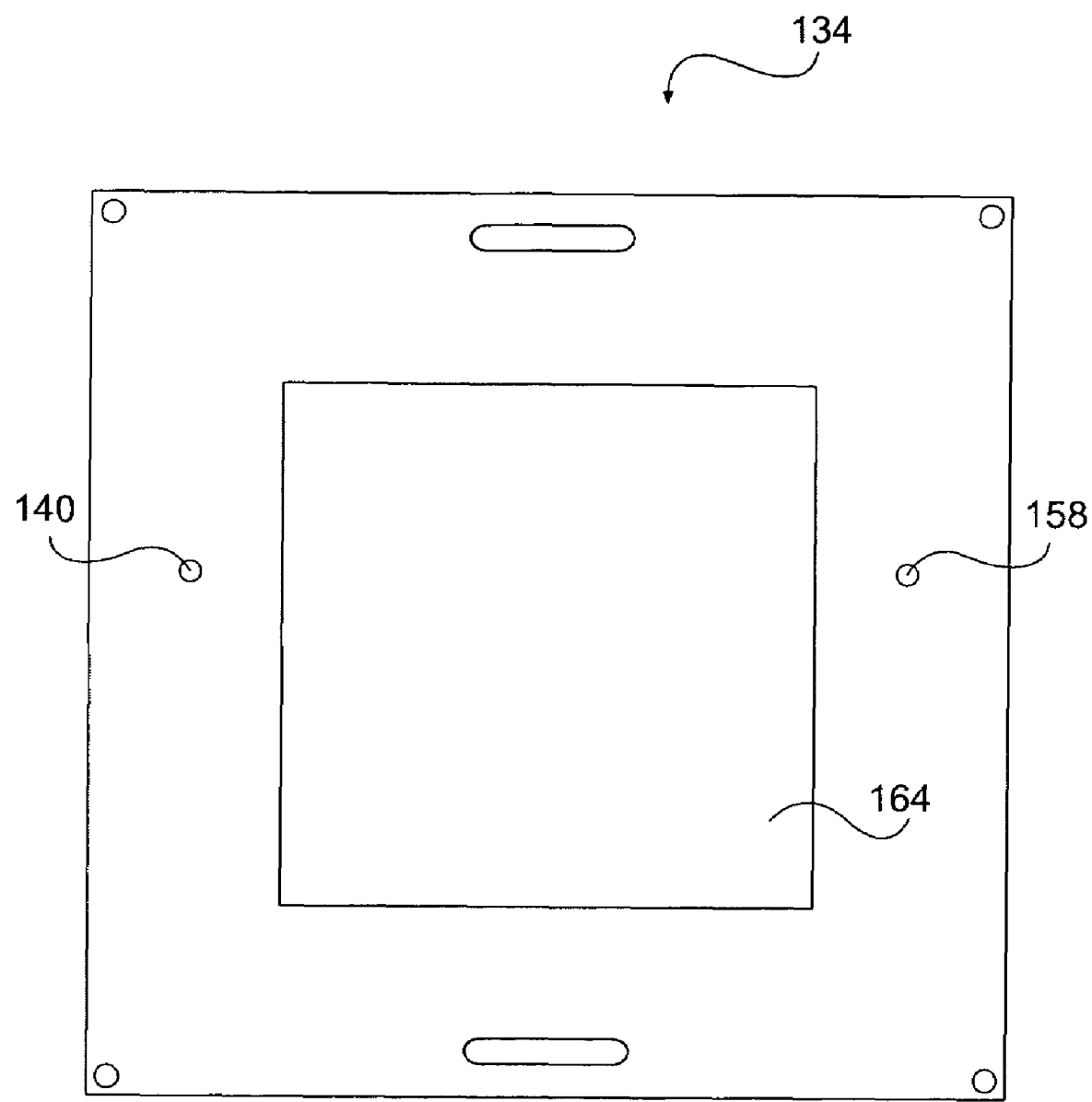
FIG. 17 is a top view of the bottom cover of FIG. 10.

Referring to FIGS. 14 and 15, the mounting posts 140, 158 are not permanently retained within the retention members 54, 56. The connector 50 may be separated from the bottom cover 154 by pulling the connector 50 away from the bottom cover 154 with a predetermined force sufficient to overcome the friction fit between the fingers 100, 102, 106, 108, 110 of the retention member 54 and the mounting post 140. Referring to FIG. 12, once the mounting post 140 is removed from the retention member 54, the fingers will return to the normal position. Because the retention members 54, 56 may be made of flexible material that may not plastically deform as the fingers move between the normal and retaining positions, the retention members 54, 56 may be used repeatedly to retain and release the mounting posts 140, 158. The retention members 54, 56 may also be used with other compatibly configured mounting posts on other packaging assemblies or electrical component elements.

Figure 18:
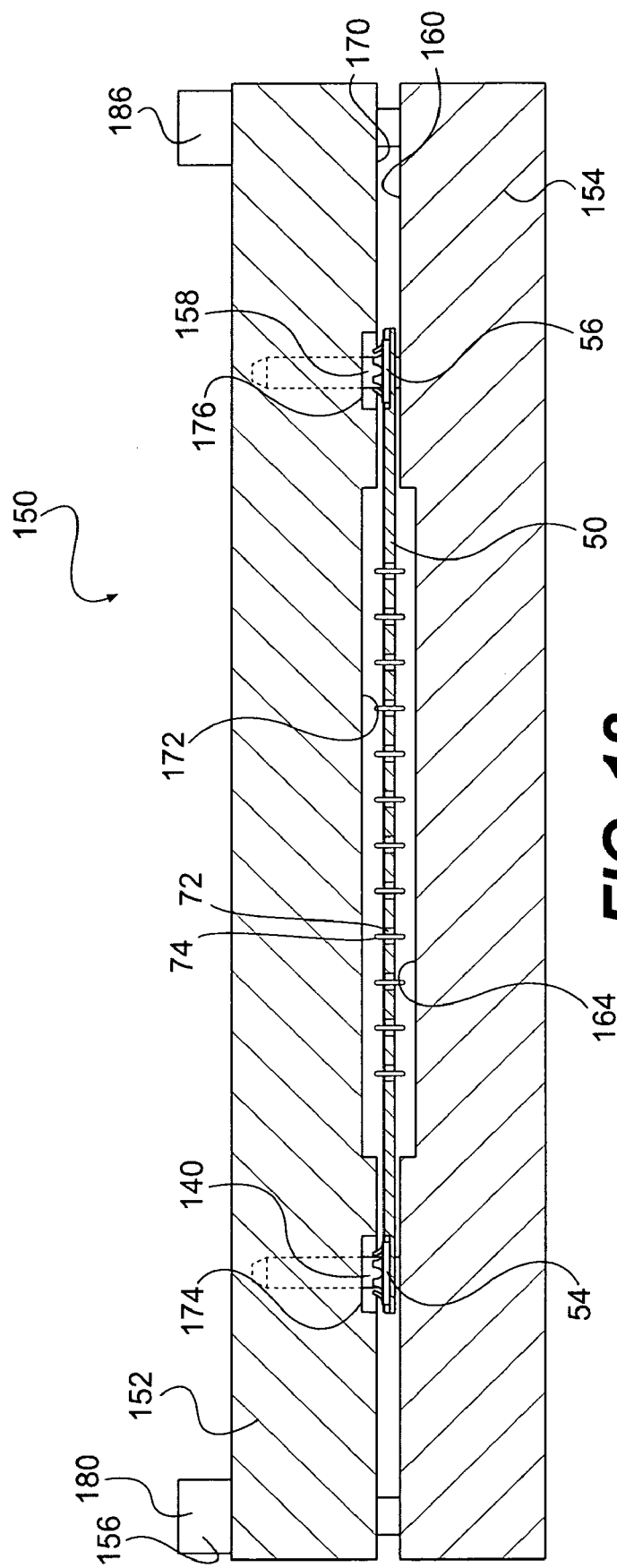
FIG. 18 is a cross-sectional view along line 18-18 of FIG. 10.
Figure 19:
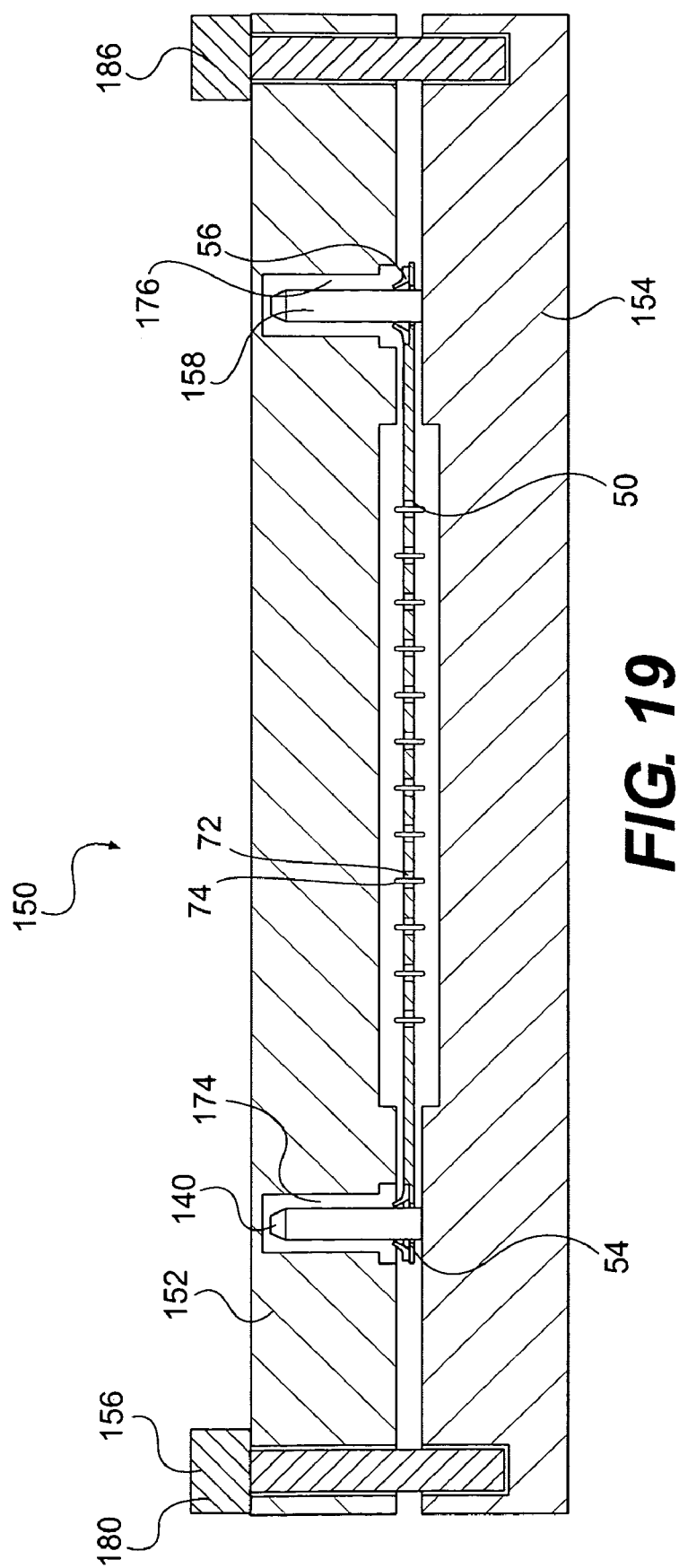
FIG. 19 is a cross-sectional view along line 19-19 of FIG. 10.

Referring to FIG. 18, after the electrical connector 50 is mounted to the bottom cover 154, the top cover 152 may be attached over the bottom cover 154 and the connector 50. The electrical connector 50 may thereby be secured within the packaging assembly 150 between the top and bottom covers 152, 154. The top cover 152 includes an inside surface 170 which is disposed against the electrical connector 50 and the inside surface 160 of the bottom cover 152 when the packaging assembly 150 is assembled. The inside surface 170 includes a recess 172 for receiving the contacts of the electrical connector 50 and first and second post holes 174, 176 for receiving the mounting posts 140, 158.

Referring to FIG. 18, the recess 172 of the top cover 152 and the recess 164 of the bottom cover 154 form a pocket in which to encapsulate the contacts 74 of the connector 50. The electrical contacts 74 may extend beyond the first and second surfaces 68, 70 of the electrical connector 50. The recesses 172, 164 of the top and bottom covers 152, 154 may ensure that the contacts 74 are not deflected as the connector 50 is packaged between the top and bottom covers 152, 154. Accordingly, the contacts 74 are not stressed, strained, or relocated as the connector 50 is assembled in the packaging assembly 150, even if the assembly 150 is assembled and dissembled repeatedly.

Figure 30:
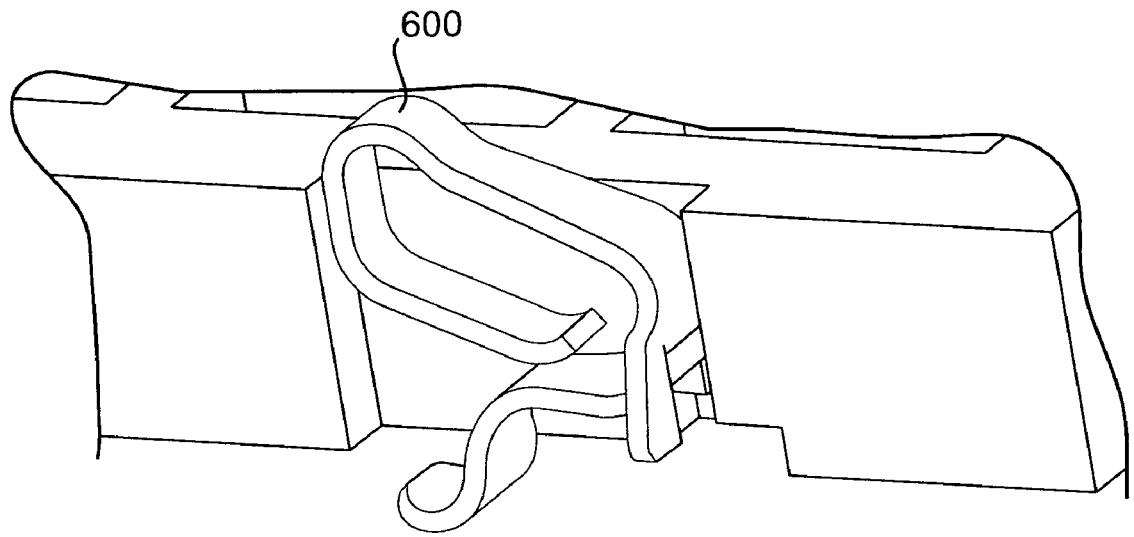
FIG. 30 is a perspective view of an embodiment of the contact.
Figure 31:
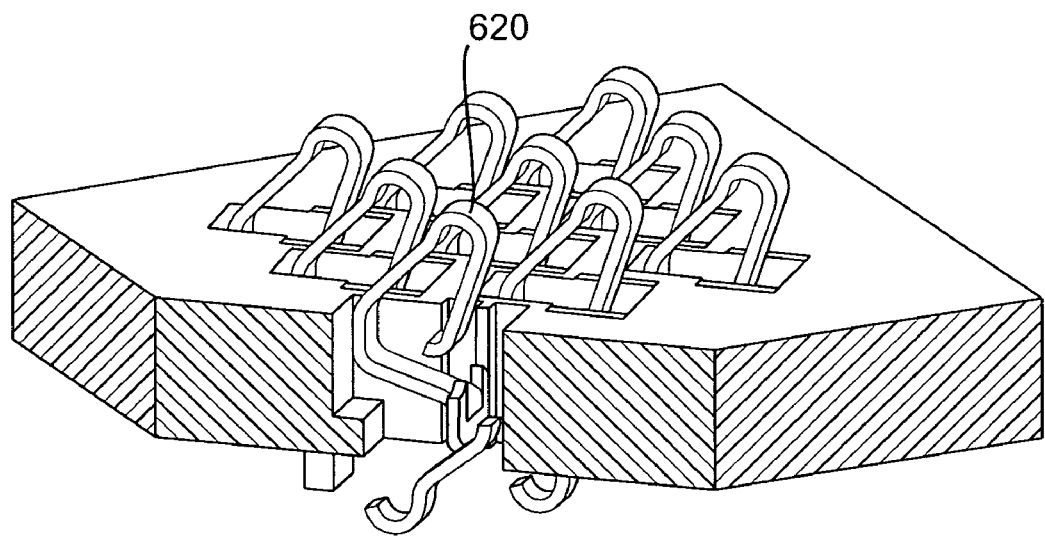
FIG. 31 is a perspective view of an embodiment of the contact.
Figure 32:
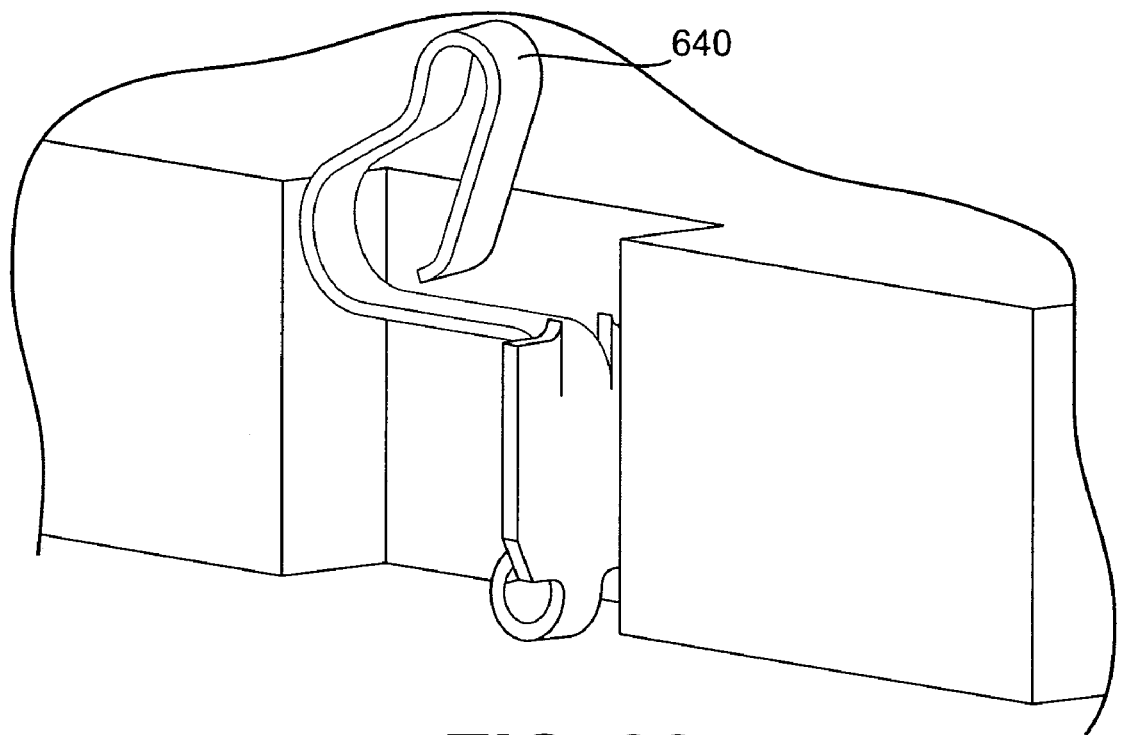
FIG. 32 is a perspective view of an embodiment of the contact.
Figure 33:
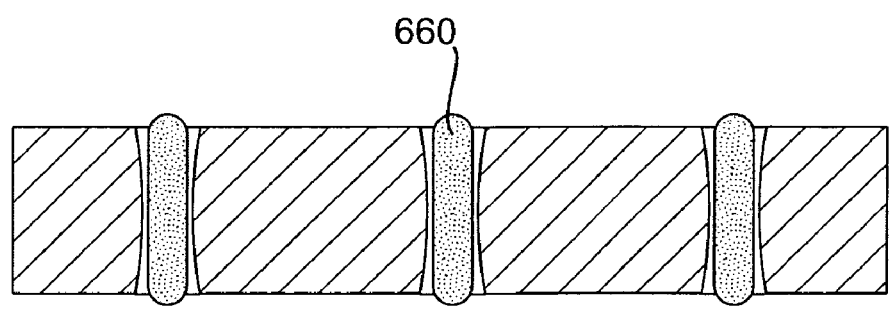
FIG. 33 is a perspective view of an embodiment of the contact.

Referring to FIG. 18, the apertures 72 of the connector 50 may retain a variety of types of contacts. In one embodiment, the contacts 74 may be resilient contacts. In one embodiment, the contact may be a contact 600, as shown in FIG. 30. The contact 600 may be a contact as described in U.S. Pat. No. 6,921,270, which is herein incorporated by reference in its entirety. In another embodiment, the contact may be a contact 620, as shown in FIG. 31. In another embodiment, the contact may be a contact 640, as shown in FIG. 32. In another embodiment, the contact may be a wadded wire contact 660, as shown in FIG. 33. The wadded wire contact 660 may be a wadded wire contact as described in U.S. Pat. No. 4,988,306, which is herein incorporated by reference in its entirety.

Figure 41:
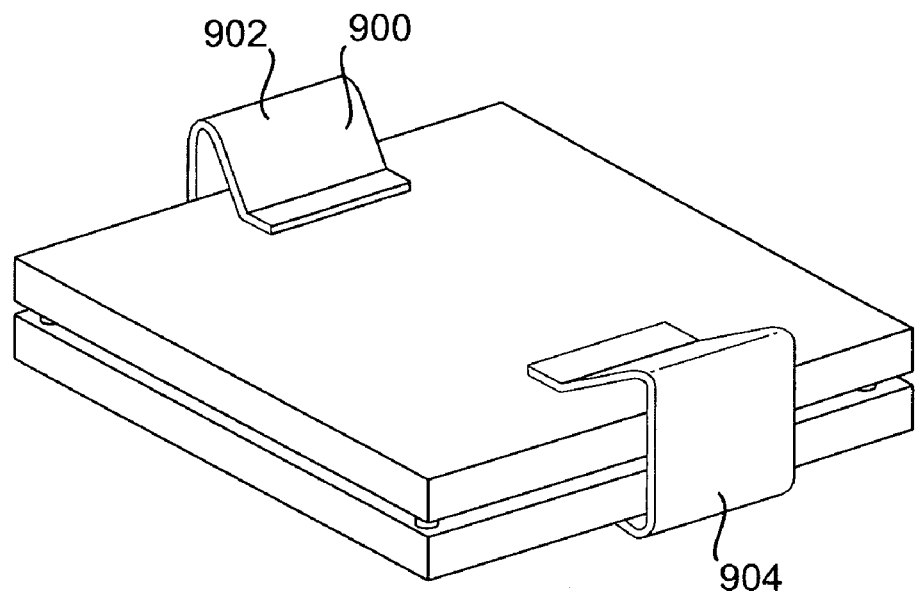
FIG. 41 is a perspective view of the packaging assembly with another embodiment of the attachment means.
Figure 42:
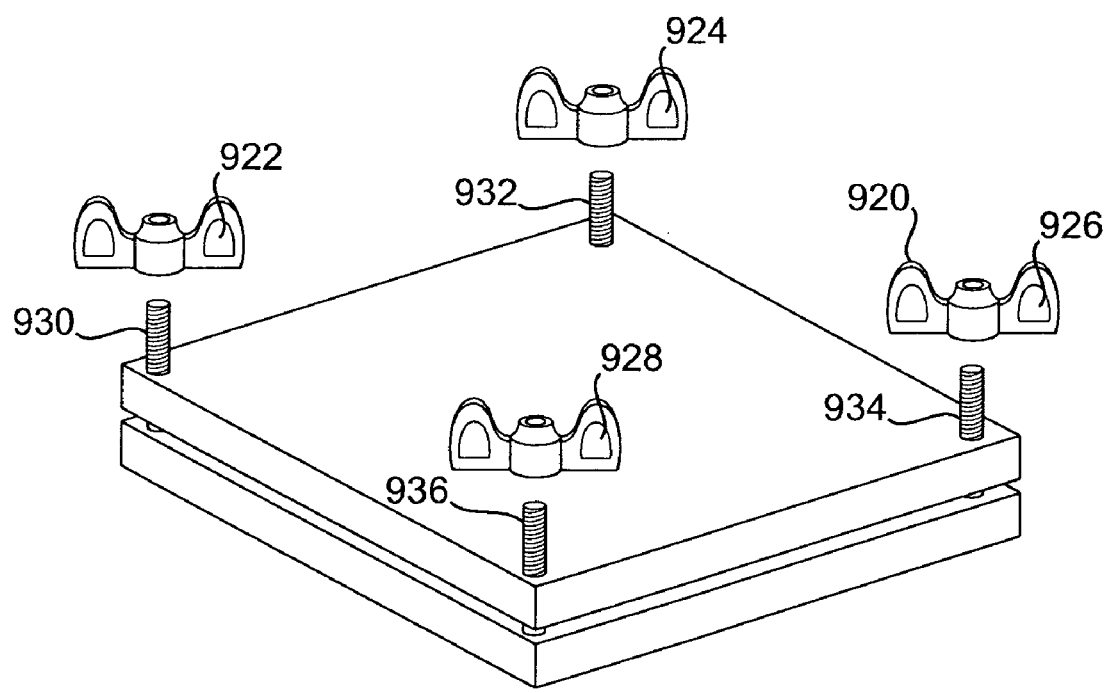
FIG. 42 is a perspective view of the packaging assembly with another embodiment of the attachment means.

Referring to FIG. 10, the packaging assembly 150 may be secured in an assembled state by the attachment means 156. The attachment means 156 may comprise first, second, third, and fourth screws 180, 182, 184, 186, which secure the top cover 152 to the bottom cover 154. Referring to FIG. 18, the screws 180, 186 do not pass through the electrical connector 50, but instead secure the top and bottom covers 152, 154 together, thereby securing the electrical connector 50 therebetween. The attachment means 156 not only secures the top cover 152 and the bottom cover 154 together but also help align the packaging assembly 150 in a predetermined configuration. In other embodiments, the attachment means may be other types of attachment means. In one embodiment, the attachment means 900 may be clips or clamps 902, 904, as shown in FIG. 41. In another embodiment, the attachment means may be nut 922, 924, 926, 928 and screw 930, 932, 934, 936 assemblies, as shown in FIG. 42.

Referring to FIG. 13, to disassemble the packaging assembly 150, the attachment means 156 are first disengaged from the assembly 150. The top cover 152 may then be removed. At this point, the connector 50 is accessible. To finish the disassembly, the connector 50 is removed from the bottom cover 154 by pulling the connector 50 away from the bottom cover 154 with sufficient force to overcome the engagement between the mounting posts 140, 158 and the retention members 54, 56, as shown in FIG. 12. The connector 50 may then be assembled with other components, manipulated, or repackaged in the packaging assembly 150.

Figure 20:
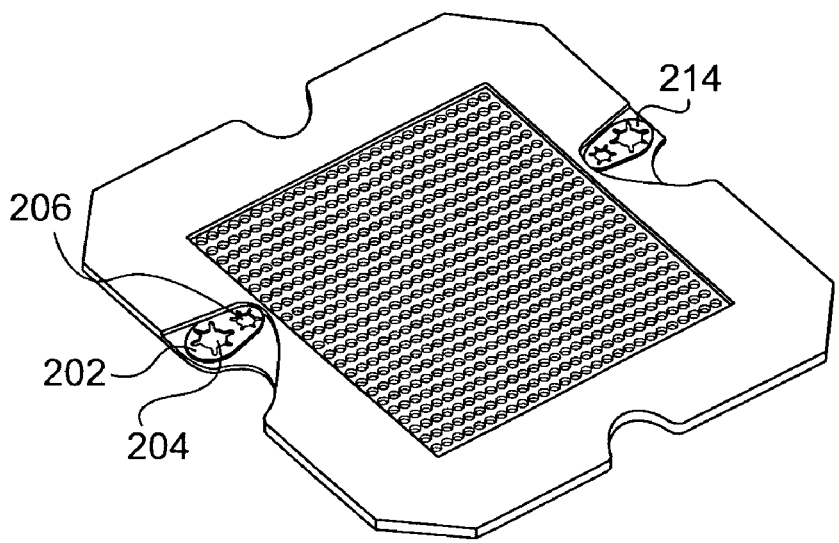
FIG. 20 is a perspective view of another embodiment of the electrical connector.
Figure 21:
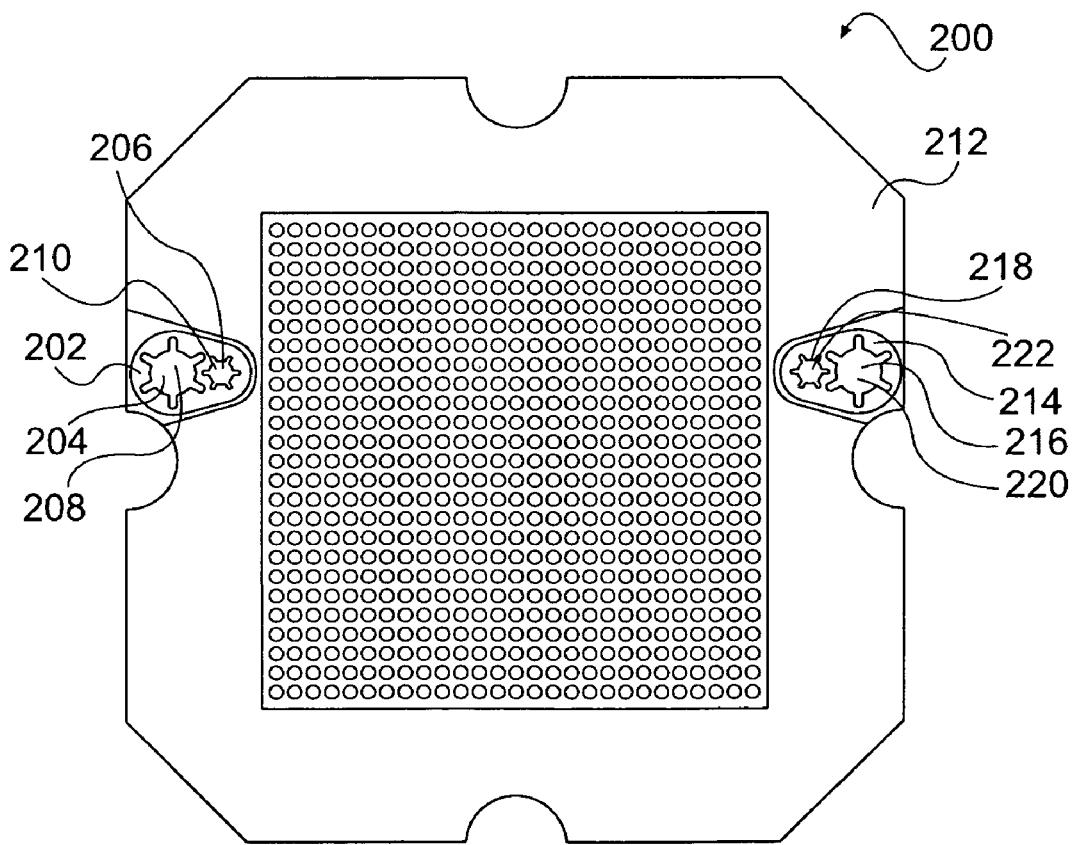
FIG. 21 is a top view of the electrical connector of FIG. 20.

Referring to FIGS. 20 and 21, there is shown another embodiment of the electrical connector 200. The electrical connector 200 may include a first retention member 202 with a first opening 204 and a second opening 206. The first and second openings 204, 206 may align with first and second holes 208, 210, respectively, in the insulative housing 212. The connector 200 may also include a second retention member 214 having first and second openings 216, 218 that align with third and fourth holes 220, 222, respectively, in the insulative housing 212.

Figure 22:
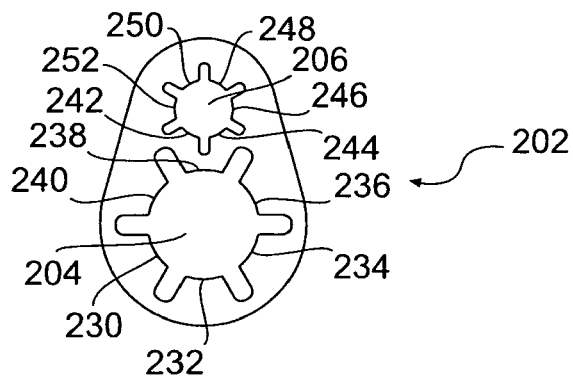
FIG. 22 is a top view of the retention member of FIG. 20.

The first retention member may be similar to the second retention member, so only the first retention member will be describe in detail. Referring to FIG. 22, the first retention member 202 may include flexible fingers 230, 232, 234, 236, 238, 240, 242, 244, 246, 248, 250, 252 extending into the first and second openings 204, 206, respectively. The second opening 206 may be of different size than the first opening 204. In one embodiment, the second opening 206 may be smaller than the first opening 204. The fingers 242, 244, 246, 248, 250, 252 of the second opening 206 may likewise be smaller than the fingers 230, 232, 234, 236, 238, 240, of the first opening 204.

Figure 23:
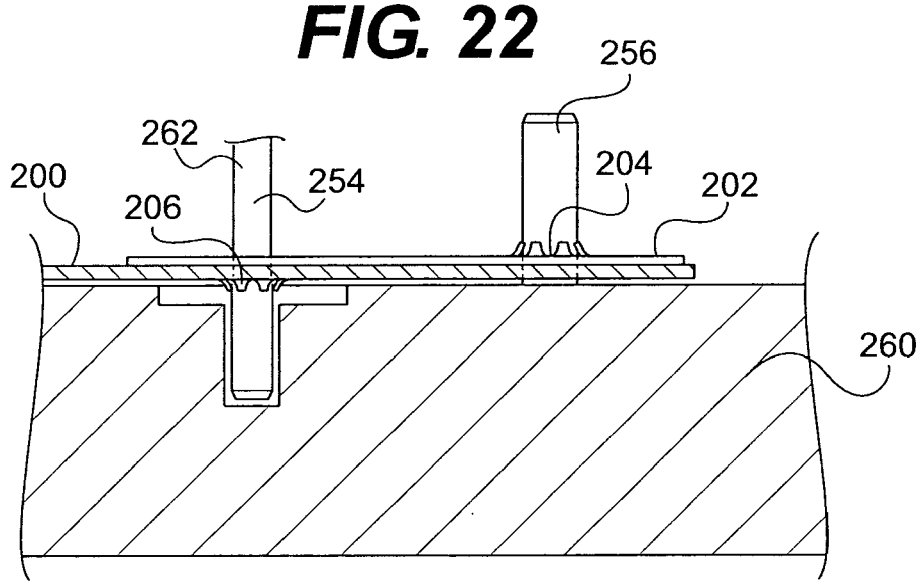
FIG. 23 is cross-sectional view of the electrical connector mounted to a packaging assembly element and a receiving a tool.
Figure 24:
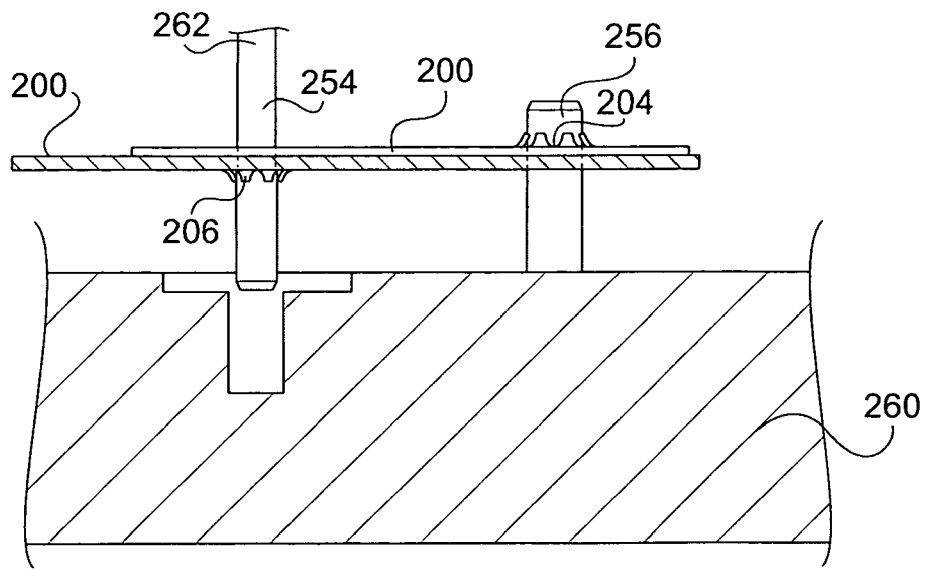
FIG. 24 is the same view as FIG. 23, except that the tool is removing the electrical connector.

Referring to FIGS. 23 and 24, the second opening 206 of the retention member 202 may be configured to flexibly engage a mounting post 254 of a different size than the mounting post 256 of the first opening 204. The second opening 206 may have a different retention strength than the first opening 204. Referring to FIG. 23, the first opening 204 of the retention member 202 may flexibly engage a mounting post 256 of a packaging assembly element 260 to mount the connector 200 thereto. A mounting post 254 of a tool 262 may be inserted into the second opening 206 which may have a stronger retention strength than the first opening 204. Accordingly, when the tool 262 is pulled away from the packaging assembly element 260, the tool 262 will pull the connector 200 away from the element 260, as shown in FIG. 24. Because of the different retention strengths of the openings 204, 206, the tool 262 may be used to pull the connector 200 off of the mounting post 256 and thereby remove the connector 200 from the packaging assembly element 260.

Figure 29:
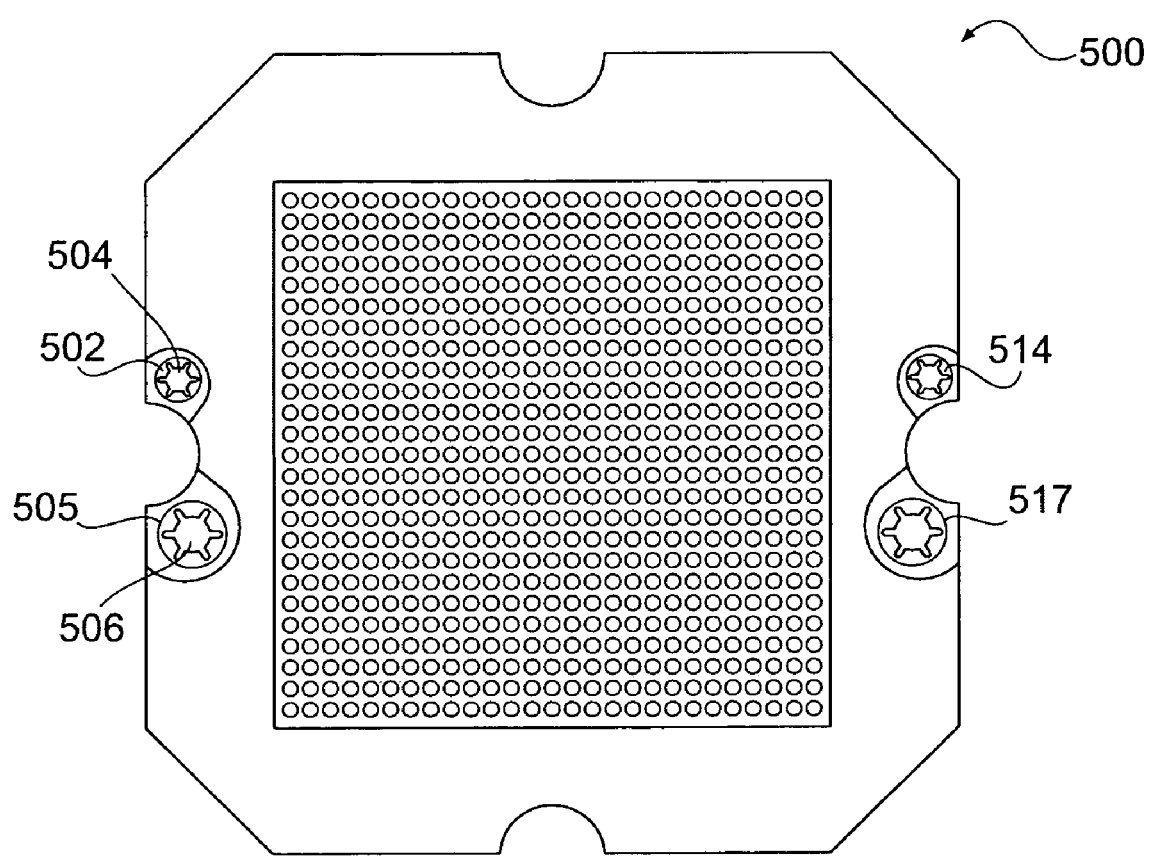
FIG. 29 is a perspective view of another embodiment of the connector.

Referring to FIG. 29, the connector may have four retention members. The connector 500 may have a first retention member 502, a second retention member 514, a third retention member 505 and a fourth retention member 517. The first retention member 502 may have a first opening 504 with fingers which is constructed similar to first opening 204 with fingers. The second retention member 514 may be constructed similar to the first retention member. The third retention member 505 may have a second opening 506 with fingers which is constructed similar to second opening 206 with fingers. The fourth retention member 514 may be constructed similar to the third retention member. In other embodiments, the connector may have three, five, six or more retention members.

Figure 25:
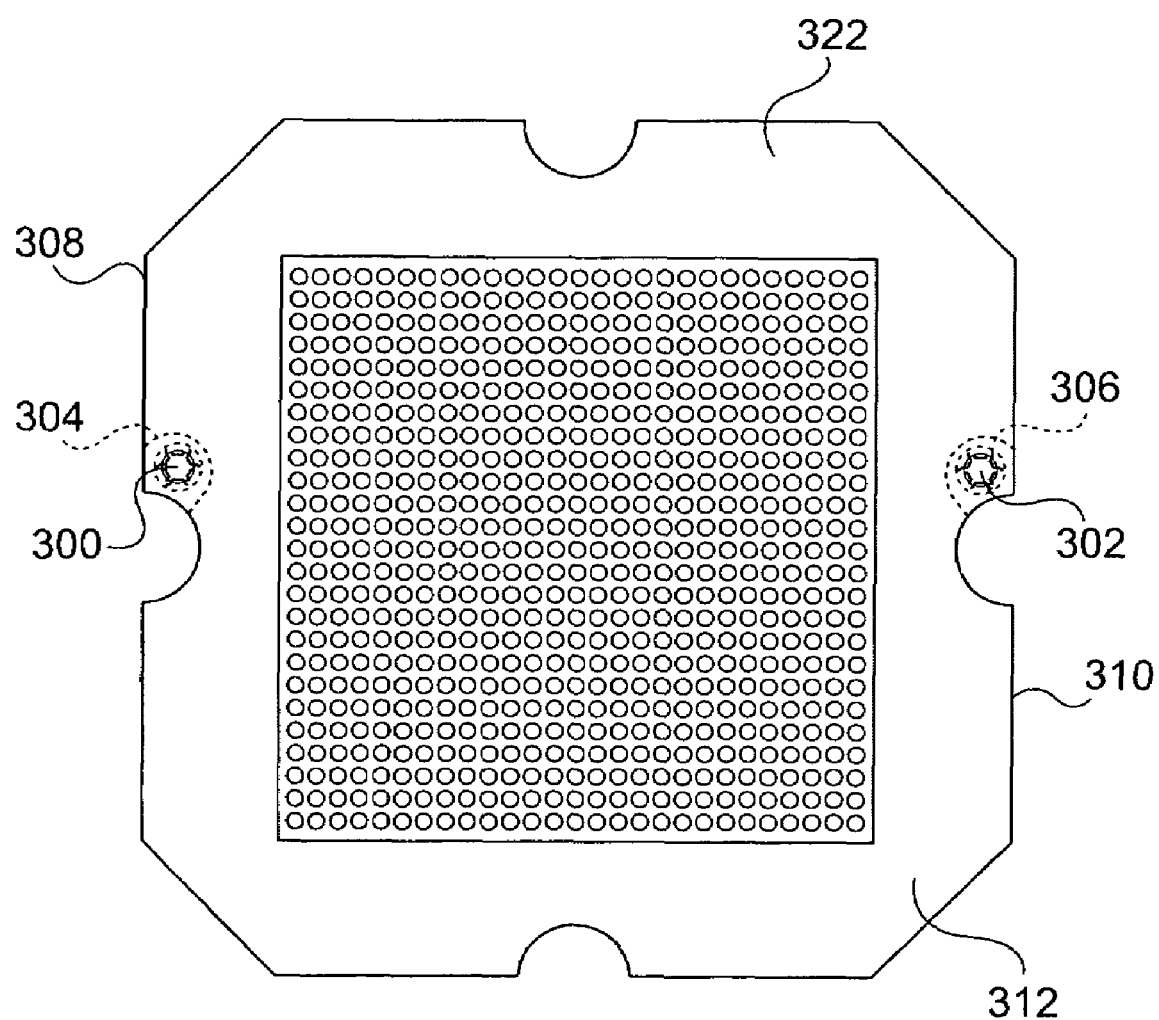
FIG. 25 is a top view of another embodiment of the electrical connector
Figure 26:
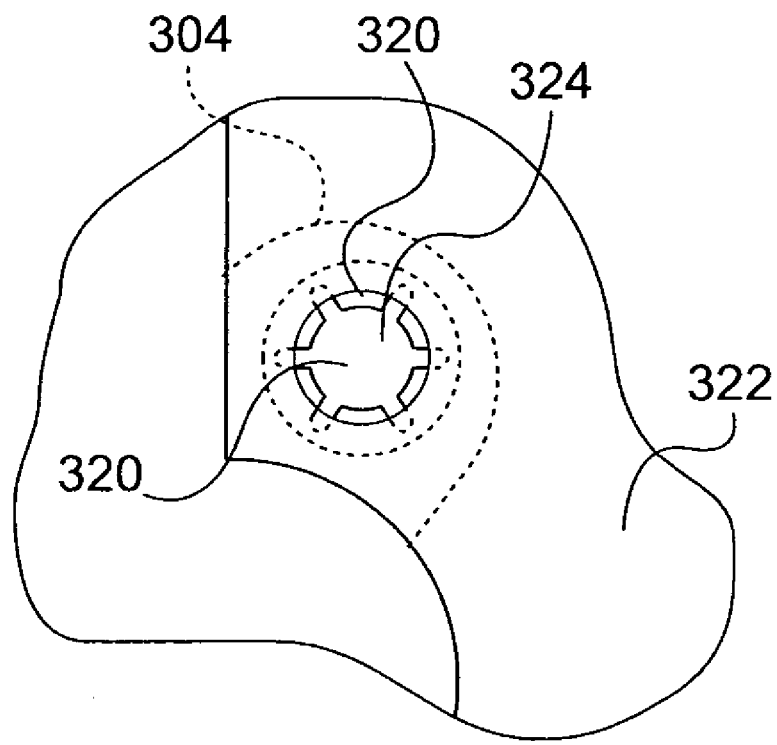
FIG. 26 is a partial view of FIG. 25 showing the first retention member.
Figure 27:
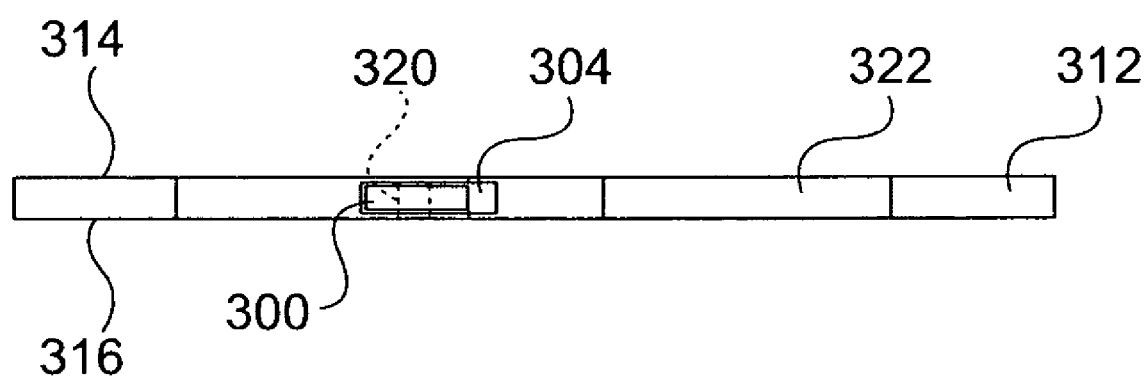
FIG. 27 is a side view of the electrical connector of FIG. 25.

Referring to FIGS. 25 and 26, in another embodiment, the retention members 300, 302 may be mounted in slots 304, 306 in the edges 308, 310 of the electrical connector 312. The first retention member 300 and the second retention member 302 may be similarly constructed. Therefore, only the first retention member will be described in detail. Referring to FIG. 27, the electrical connector 312 may include a slot 304 between the first surface 314 and second surface 316 for receiving the retention member 300. The slot 304 may align with the first hole 320 in the housing 322, such that when the retention member 300 is fully inserted into the slot 304, the opening 324 of the retention member 300 will communicate with the hole 320 in the housing 322, as shown in FIG. 26. After the retention member 300 is inserted into the slot 304, the retention member 300 may be secured in position by being heat staked within the slot 304. Referring to FIG. 25, once secured within the first and second slots 304, 306, the first and second retention members 300, 302 may operate similarly to the retention members of the earlier described embodiments.

All references, including publications, patent applications, and patents, cited herein are hereby incorporated by reference to the same extent as if each reference were individually and specifically indicated to be incorporated by reference and were set forth in its entirety herein.

The use of the terms "a" and "an" and "the" and similar referents in the context of describing the invention (especially in the context of the following claims) are to be construed to cover both the singular and the plural, unless otherwise indicated herein or clearly contradicted by context. The terms "comprising," "having," "including," and "containing" are to be construed as open-ended terms (i.e., meaning "including, but not limited to,") unless otherwise noted. Recitation of ranges of values herein are merely intended to serve as a shorthand method of referring individually to each separate value falling within the range, unless otherwise indicated herein, and each separate value is incorporated into the specification as if it were individually recited herein. All methods described herein can be performed in any suitable order unless otherwise indicated herein or otherwise clearly contradicted by context. The use of any and all examples, or exemplary language (e.g., "such as") provided herein, is intended merely to better illuminate the invention and does not pose a limitation on the scope of the invention unless otherwise claimed. No language in the specification should be construed as indicating any non-claimed element as essential to the practice of the invention.

Preferred embodiments of this invention are described herein, including the best mode known to the inventor(s) for carrying out the invention. Variations of those preferred embodiments may become apparent to those of ordinary skill in the art upon reading the foregoing description. The inventor(s) expect skilled artisans to employ such variations as appropriate, and the inventor(s) intend for the invention to be practiced otherwise than as specifically described herein. Accordingly, this invention includes all modifications and equivalents of the subject matter recited in the claims appended hereto as permitted by applicable law. Moreover, any combination of the above-described elements in all possible variations thereof is encompassed by the invention unless otherwise indicated herein or otherwise clearly contradicted by context.

The invention claimed is:

1. An electrical connector comprising;
   an insulative housing including a first surface, a second surface, and at least one aperture extending between the first and second surfaces for receiving at least one electrical contact, the housing including at least one hole therethrough; and
   at least one retention member, the retention member defining an opening therethrough, the retention member including a plurality of fingers extending into the opening, wherein the retention member is attached to the housing such that the opening of the retention member communicates with the hole of the housing, wherein the retention member is not an electrical contact.

2. The retention member of claim 1 wherein the fingers of the retention member are comprised of a flexible material.

3. The electrical connector of claim 2 wherein the retention member is configured to engage a mounting post selectively inserted into the retention member, the fingers flexibly engaging the mounting post to retain the mounting post in the retention member.

4. The electrical connector of claim 1 wherein the retention member is annular, the retention member including an outer ring surrounding the opening, the opening being located at the center of the retention member.

5. The electrical connector claim 4 wherein the fingers of the retention member extend towards the center of the retention member from the outer ring.

6. The electrical connector of claim 1 wherein the each finger is similarly configured and includes a first side, a second side, and an end, the first sides and second sides of the fingers being separated by gaps.

7. The electrical connector of claim 1 wherein the electrical connector includes a plurality of electrical contacts disposed in a plurality of apertures.

8. The electrical connector of claim 1 wherein the first surface of the housing is generally planar, the retention member is generally planar having a top surface and a bottom surface, wherein the bottom surface of the retention member is attached to the first surface of the housing.

9. The electrical connector of claim 1 wherein the housing includes a recess around the hole, the retention member being attached in the recess.

10. The electrical connector of claim 1 wherein the retention member is attached to the first surface by an adhesive.

11. The electrical connector of claim 10 wherein the adhesive is applied to the retention member as a ring such that the fingers do not include adhesive proximate their respective ends.

12. The electrical connector of claim 1 further comprising a second hole in the insulative housing and a second retention member including an opening, wherein the opening of the second retention member communicates with the second hole of the housing.

13. The electrical connector of claim 1 wherein the retention member includes a second opening.

14. The electrical connector of claim 13 wherein the first and second openings of the retention member have different grip strengths.

15. The electrical connector of claim 1 wherein the retention member is disposed in a slot in the side of the housing.

16. The electrical connector of claim 1 wherein the retention member is made of a polyimide film.

17. A packaging assembly for an electrical connector comprising;
   an electrical connector comprising an insulative housing including a first surface, a second surface, and at least one aperture extending between the first and second surfaces for receiving at least one electrical contact, the housing including at least one hole therethrough, and at least one retention member, the retention member defining an opening therethrough, the retention member including a plurality of fingers extending into the opening, wherein the retention member is attached to the housing such that the opening of the retention member communicates with the hole of the housing, wherein the retention member is not an electrical contact;
   a top cover selectively disposed over at least a portion of the first surface of the housing; and
   a bottom cover selectively disposed over at least a portion of the second surface of the housing such that the electrical connector is disposed between the top and bottom covers,
   wherein the top cover and the bottom cover are selectively attached by attachment means.

18. The packaging assembly of claim 17 wherein the bottom cover includes an inside surface facing the second surface of the insulative housing and a mounting post extending from the inside surface, the mounting post extending through the hole of the housing and through the opening of the retention member, the fingers of the retention member flexibly engaging the mounting post to retain the mounting post in the retention member.

19. The packaging assembly of claim 18 wherein,
   the insulative housing includes a second hole in the insulative housing and a second retention member including an opening, wherein the opening of the second retention member communicates with the second hole of the housing, and
   the bottom cover includes a second mounting post extending from the inside surface, the mounting post extending through the second hole of the housing and through the opening of the second retention member, the fingers of the second retention member flexibly engaging the mounting post to retain the mounting post in the retention member.

20. The packaging assembly of claim 19 wherein the mounting posts position the electrical connector at a predetermined position within the packaging assembly.

21. The packaging assembly of claim 17 wherein the connector includes a plurality of apertures, wherein each aperture includes an electrical contact.

22. The packaging assembly of claim 21 wherein the bottom cover includes a recess on an inside surface for receiving the electrical contacts.

23. The packaging assembly of claim 21 wherein the top cover includes a recess on an inside surface for receiving the electrical connector.

24. The packaging assembly of claim 18 wherein the top cover may be removed from the packaging assembly.

25. The packaging assembly of claim 24 wherein the electrical connector may be removed from the bottom cover by lifting the electrical connector away from the bottom cover with a predetermined force sufficient to overcome the engagement between the retention member and the mounting post.

26. The packaging assembly of claim 21 wherein the electrical contacts of the electrical connector are encapsulated between the top and bottom covers.

27. The packaging assembly of claim 17 wherein the attachment means is at least one screw.

28. The packaging assembly of claim 27 wherein the attachment means includes more than one screw such that the screws align the top cover and the bottom cover in a predetermined configuration.

29. The packaging assembly of claim 17 wherein the retention member is attached to the insulative housing by an adhesive.

30. The packaging assembly of claim 17 wherein the retention member includes a second opening.

31. The packaging assembly of claim 17 wherein the retention member is made of a polyimide film.

32. An electrical connector comprising;
an insulative housing including a first surface, a second surface, and at least one aperture extending between the first and second surfaces for receiving at least one electrical contact, the housing including at least one hole therethrough; and
at least one retention member, the retention member defining an opening therethrough, the retention member including a plurality of fingers extending into the opening, wherein the retention member is attached to the housing such that the opening of the retention member communicates with the hole of the housing, wherein the housing includes a recess around the hole, the retention member being attached in the recess.

33. A packaging assembly for an electrical connector comprising;
an electrical connector comprising an insulative housing including a first surface, a second surface, and at least one aperture extending between the first and second surfaces for receiving at least one electrical contact, the housing including at least one hole therethrough, and at least one retention member, the retention member defining an opening therethrough, the retention member including a plurality of fingers extending into the opening, wherein the retention member is attached to the housing such that the opening of the retention member communicates with the hole of the housing;
a top cover selectively disposed over at least a portion of the first surface of the housing;
a bottom cover selectively disposed over at least a portion of the second surface of the housing such that the electrical connector is disposed between the top and bottom covers, the bottom cover includes a recess on an inside surface for receiving the electrical contact; and
wherein the top cover and the bottom cover are selectively attached by attachment means.

34. A packaging assembly for an electrical connector comprising;
an electrical connector comprising an insulative housing including a first surface, a second surface, and at least one aperture extending between the first and second surfaces for receiving at least one electrical contact, the housing including at least one hole therethrough, and at least one retention member, the retention member defining an opening therethrough, the retention member including a plurality of fingers extending into the opening, wherein the retention member is attached to the housing such that the opening of the retention member communicates with the hole of the housing;
a top cover selectively disposed over at least a portion of the first surface of the housing, the top cover includes a recess on an inside surface for receiving the electrical connector;
a bottom cover selectively disposed over at least a portion of the second surface of the housing such that the electrical connector is disposed between the top and bottom covers; and
wherein the top cover and the bottom cover are selectively attached by attachment means.

\* \* \* \* \*

UNITED STATES PATENT AND TRADEMARK OFFICE
CERTIFICATE OF CORRECTION

PATENT NO. : 7,435,099 B2 Page 1 of 1
APPLICATION NO. : 11/643387
DATED : October 14, 2008
INVENTOR(S) : Kirkus It is certified that error appears in the above-identified patent and that said Letters Patent is hereby corrected as shown below:

Column 2, Lines 44-45: "a receiving a tool" should read --a receiving tool--.

Signed and Sealed this

Thirtieth Day of December, 2008

JON W. DUDAS
*Director of the United States Patent and Trademark Office*